(12) United States Patent
Kanai et al.

(10) Patent No.: US 10,331,161 B2
(45) Date of Patent: Jun. 25, 2019

(54) POWER SUPPLY BOARD

(71) Applicant: FUJITSU LIMITED, Kawasaki-shi, Kanagawa (JP)

(72) Inventors: Yuki Kanai, Kawasaki (JP); Takashi Imamoto, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 222 days.

(21) Appl. No.: 14/962,634

(22) Filed: Dec. 8, 2015

(65) Prior Publication Data

US 2016/0192489 A1 Jun. 30, 2016

(30) Foreign Application Priority Data

Dec. 24, 2014 (JP) ................. 2014-260402
May 22, 2015 (JP) ................. 2015-104520
Oct. 15, 2015 (JP) ................. 2015-203882

(51) Int. Cl.
*H05K 7/10* (2006.01)
*H05K 7/12* (2006.01)
(Continued)

(52) U.S. Cl.
CPC ............. *G06F 1/00* (2013.01); *H05K 1/0265* (2013.01); *H05K 1/144* (2013.01); *H05K 1/113* (2013.01);
(Continued)

(58) Field of Classification Search
CPC ........ G06F 1/00; H05K 1/0265; H05K 1/113; H05K 1/141; H05K 1/144;
(Continued)

(56) References Cited

U.S. PATENT DOCUMENTS 6,303,989 B1 * 10/2001 Yasuho ................... H01L 25/18
257/706
6,354,844 B1 * 3/2002 Coico .................... H05K 3/325
439/260

(Continued)

FOREIGN PATENT DOCUMENTS

JP        6-224533      8/1994
JP     2001-267714      9/2001

(Continued)

OTHER PUBLICATIONS

Notification of Reasons for Refusal for Japanese Application No. 2015-203882 dated Mar. 5, 2018.

*Primary Examiner* — Yuriy Semenenko
(74) *Attorney, Agent, or Firm* — Staas & Halsey LLP

(57) ABSTRACT

A power supply board includes: a first board including a top surface on which a processor is capable of being mounted, a bottom surface located on an opposite side of the top surface, and a plurality of first through holes and a plurality of second through holes capable of being electrically connected with the processor by penetrating through the first board from the top surface to the bottom surface; a second board arranged at a position distant from the bottom surface of the first board and provided with a power supply device; a first conductor mounted on the bottom surface of the first board and electrically connects the plurality of first through holes and the power supply device, and a second conductor mounted on the bottom surface of the first board and electrically connects the plurality of second through holes and the power supply device.

14 Claims, 22 Drawing Sheets

(51) Int. Cl.
   *G06F 1/00*  (2006.01)
   *H05K 1/02*  (2006.01)
   *H05K 1/14*  (2006.01)
   *H05K 1/11*  (2006.01)

(52) U.S. Cl.
   CPC ....... *H05K 1/141* (2013.01); *H05K 2201/042* (2013.01); *H05K 2201/0979* (2013.01); *H05K 2201/09309* (2013.01); *H05K 2201/10242* (2013.01); *H05K 2201/10303* (2013.01)

(58) Field of Classification Search
   CPC ... H05K 2201/042; H05K 2201/09309; H05K 2201/0979; H05K 2201/10242; H05K 2201/10303
   See application file for complete search history.

(56) References Cited

U.S. PATENT DOCUMENTS

| | | | | |
|---|---|---|---|---|
| 6,392,899 | B1* | 5/2002 | Harrison | G06F 1/189 248/610 |
| 7,167,379 | B2* | 1/2007 | DiBene, II | G06F 1/18 257/691 |
| 7,773,390 | B2* | 8/2010 | Weir | H01L 23/66 361/760 |
| 7,843,302 | B2* | 11/2010 | Mano | H01F 17/0006 336/200 |
| 2001/0030882 | A1 | 10/2001 | Pitzele | |
| 2001/0053068 | A1* | 12/2001 | Murayama | H05K 1/144 361/760 |
| 2003/0198033 | A1* | 10/2003 | Panella | H05K 1/0262 361/760 |
| 2004/0027802 | A1* | 2/2004 | Duerbaum | H05K 1/141 361/688 |
| 2005/0146017 | A1 | 7/2005 | Koide | |
| 2006/0169488 | A1 | 8/2006 | Kaji | |
| 2007/0257761 | A1 | 11/2007 | Mano et al. | |
| 2008/0116589 | A1* | 5/2008 | Li | H01L 21/563 257/780 |
| 2009/0296360 | A1* | 12/2009 | Doblar | H05K 1/0262 361/767 |
| 2010/0027228 | A1* | 2/2010 | Tsukada | H05K 1/0204 361/772 |
| 2012/0187585 | A1* | 7/2012 | Yamazaki | H01L 23/053 257/795 |
| 2013/0118008 | A1* | 5/2013 | Gaynes | H05K 1/0206 29/836 |
| 2015/0319880 | A1* | 11/2015 | Strickland | H05K 7/20 361/711 |

FOREIGN PATENT DOCUMENTS

| | | |
|---|---|---|
| JP | 2002-246512 | 8/2002 |
| JP | 2003-518759 | 6/2003 |
| JP | 2006-210852 | 8/2006 |
| WO | WO 2004/004000 A1 | 1/2004 |
| WO | WO 2007/129526 A1 | 11/2007 |

* cited by examiner

POWER SUPPLY BOARD

CROSS-REFERENCE TO RELATED APPLICATION

This application is based upon and claims the benefit of priority of the prior Japanese Patent Application No. 2014-260402, filed on Dec. 24, 2014, the prior Japanese Patent Application No. 2015-104520, filed on May 22, 2015, and the prior Japanese Patent Application No. 2015-203882, filed on Oct. 15, 2015, the entire contents of which are incorporated herein by references.

FIELD

The embodiments discussed herein are related to a power supply board.

BACKGROUND

When an electrical power is supplied to an information processing apparatus such as a server apparatus, a primary power supply (AC power supply) supplied from a commercial power supply is converted into a secondary power supply (low voltage DC power supply) by a power source unit provided in the apparatus and the power is supplied to respective places on a board such as a motherboard provided in the apparatus. The power is supplied to each component after a voltage value of the power to be supplied to respective places on the board is further converted into a voltage value corresponding to each component by a DC/DC converter. When electrical power is supplied to a processor such as a CPU (Central Processing Unit), the power is supplied to the processor after the voltage value of the power to be supplied to respective places on the board is further converted into a voltage value corresponding to the processor by a DC/DC converter.

For example, as illustrated in FIG. 9, a CPU 111, a DIMM (Dual Inline Memory Module) 112, a DC/DC converter 113, and a high-speed signal transmission component 114 are mounted on the same plane of the board 101. As illustrated in FIG. 10, power is supplied from the DC/DC converter 113 to the CPU 111 through a plurality of power feeding paths 121 formed in the board 101. Further, as illustrated in FIG. 10, a plurality of signal transmission paths 122 is formed in the board 101. FIG. 9 is a plan view of the board 101 and FIG. 10 is a partial cross sectional view of the board 101.

The DC/DC converter 113 outputs a voltage which compensates a voltage drop occurring on the way of a power feeding path 121 in order to supply the power to the CPU 111 at a predetermined voltage. Accordingly, the DC/DC converter 113 is provided in the vicinity of the CPU 111 so as to reduce the voltage drop. The signal is transmitted at a higher speed in the server apparatus as a transmission distance between the CPU 111 and a memory such as the DIMM 112 becomes smaller, and thus the performance of the server apparatus is enhanced. For example, as illustrated in FIG. 9, the DIMM 112 or the high-speed signal transmission component 114 is arranged in the vicinity of the CPU 111 so as to make the transmission distance between the CPU 111 and the DIMM 112 shorter and make the transmission distance between the CPU 111 and the high-speed signal transmission component 114 shorter as well.

In recent years, since a demand for a high-performance server apparatus is increasing, an improvement in the performance of a processor, a speeding up of signal transmission, and an increase of a memory capacity are required. The performance of processor is improved by increasing the frequency of the processor. For example, since the power consumption of the CPU 111 increases when the frequency of the CPU 111 is increased, large current is supplied to the CPU 111 by increasing the number of the DC/DC converters 113. When there is no empty area capable of accommodating the DC/DC converter 113 in the board 101, an outer appearance of the board 101 is made larger so as to increase the number of the DC/DC converters 113 as illustrated in, for example, FIG. 11. When the outer appearance of the board 101 becomes larger and a manufacturing size of the board 101 is out of a standard size, it becomes difficult to manufacture the board 101 or the manufacturing cost of the board 101 is increased.

When the number of the DC/DC converters 113 is increased, a power feeding path 121 extending from the DC/DC converter 113 to the CPU 111 is added. As illustrated in FIG. 10, since a plurality of signal transmission paths 122 is formed in the board 101, the power feeding paths 121 to be added are formed in the board 101 by avoiding the signal transmission path 122. In this case, the number of inner layers of the board 101 is increased so as to secure the power feeding path 121 to be added in the board 101. In a case where the number of inner layers of the board 101 is increased and the manufacturing thickness of the board 101 is out of a standard thickness, it becomes difficult to manufacture the board 101 or the manufacturing cost of the board 101 is increased.

As illustrated in FIG. 12A and FIG. 12B, when the power feeding path 121 extending from the DC/DC converter 113 to CPU 111 is added, the power feeding path 121 is designed to avoid the signal transmission path 122 between the CPU 111 and the DIMM 112. FIG. 12A is a plan view of the board 101 before the power feeding path 121 is added. FIG. 12B is a plan view of the board 101 after the power feeding path 121 is added. In this case, since the power feeding path 121 to be added is formed in the board 101 while avoiding the signal transmission path 122, the power feeding path 121 becomes longer and thinner and thus the influence of voltage drop is increased. Further, when the power feeding path 121 becomes closer to the signal transmission path 122, power supply noise interferes with the signal transmission path 122 such that the transmission performance is decreased.

The followings are reference documents.
[Document 1] International Publication Pamphlet No. WO 2004/004000,
[Document 2] International Publication Pamphlet No. WO 2007/129526, and
[Document 3] Japanese National Publication of International Patent Application No. 2003-518759.

SUMMARY

According to an aspect of the invention, a power supply board includes: a first board including a top surface on which a processor is capable of being mounted, a bottom surface located on an opposite side of the top surface, and a plurality of first through holes and a plurality of second through holes capable of being electrically connected with the processor by penetrating through the first board from the top surface to the bottom surface; a second board arranged at a position distant from the bottom surface of the first board and provided with a power supply device; a first conductor mounted on the bottom surface of the first board and electrically connects the plurality of first through holes and the power supply device, and a second conductor mounted on the bottom surface of the first board and electrically connects the plurality of second through holes and the power supply device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, descriptions will be made on a power supply board (an electronic device) according to embodiments with reference to accompanying drawings. The configuration of the power supply board illustrated in the following is illustrative only and the configuration of the power supply board according to embodiments is not limited to the configuration illustrated in the following.

Embodiment 1

Figure 1:
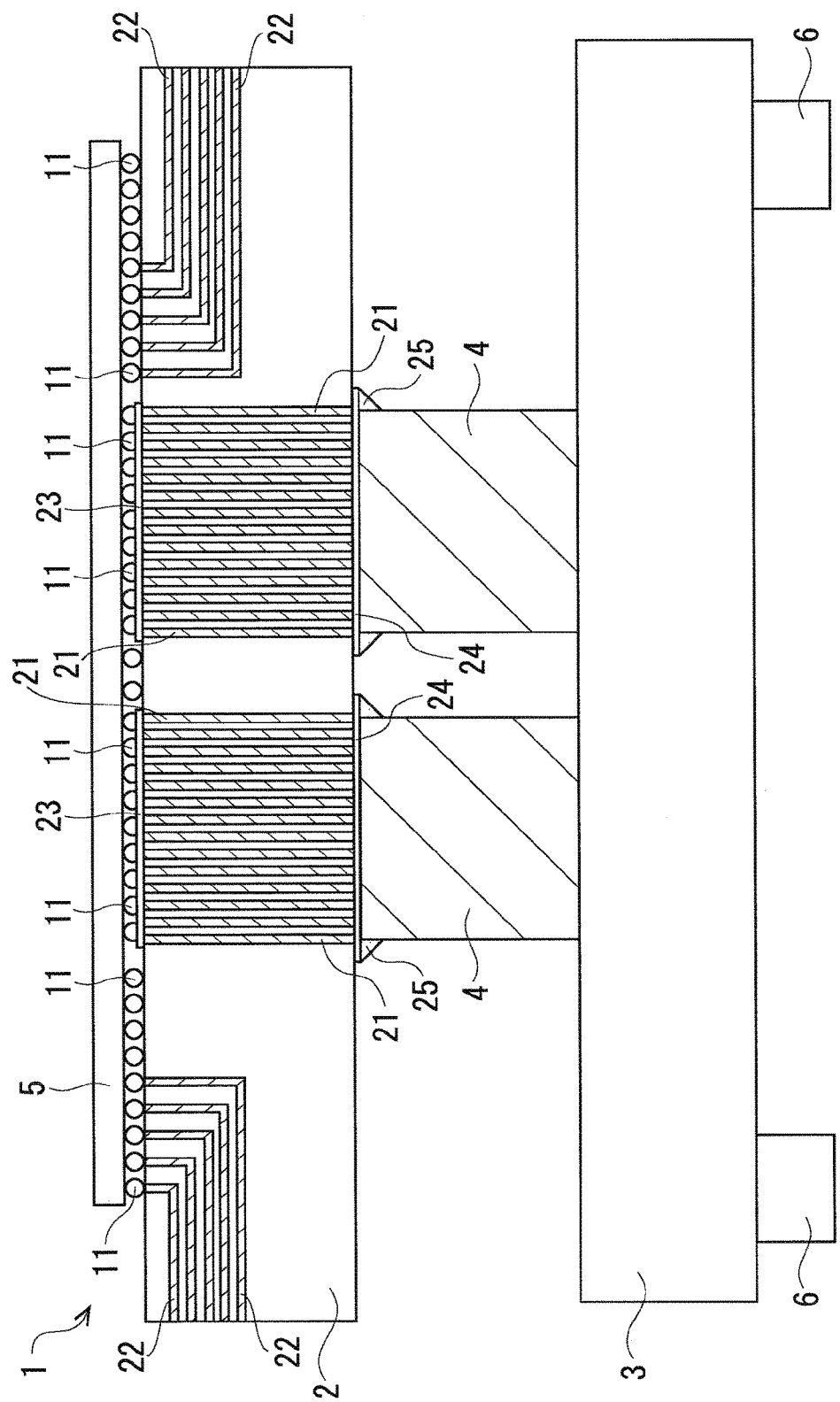
FIG. 1 is a schematic view of a power supply board.

Descriptions will be made on a power supply board 1 according to Embodiment 1. FIG. 1 is a schematic view of the power supply board 1. The power supply board 1 is provided with a main board (mother board) 2, a power board 3, and a plurality of pillars 4 arranged between the main board 2 and the power board 3. The main board 2 is formed by, for example, a plurality of resin layers. The main board 2 includes a top surface (a first surface) on which the CPU 5 may be mounted and a bottom surface (a second surface) located on the opposite side of the top surface. The CPU 5 may be mounted on the top surface of the main board 2. The CPU 5 is mounted on the top surface of the main board 2 through a plurality of solder balls 11 provided on the top surface of the main board 2. The solder balls 11 are joined to electrodes (not illustrated) formed on a circuit forming surface of the CPU 5. The main board 2 is an example of a first board. The power board 3 is an example of a second board. The CPU 5 is an example of a processor.

The main board 2 includes a plurality of through holes 21 and a plurality of signal transmission paths 22 that are formed inside thereof. A portion of the plurality of solder balls 11 are arranged on a plurality of surface patterns 23 formed on the top surface of the main board 2. In this case, the plurality of solder balls 11 is arranged on a single surface pattern 23. The surface patterns 23 have conductivity and formed by using, for example, a copper foil. The arrangement of the plurality of through holes 21 corresponds to the arrangement of the surface patterns 23, and the plurality of through holes 21 and the surface patterns 23 are electrically connected with each other.

The through hole 21 includes a hole which penetrates through the main board 2 and copper plating formed on the side walls of the hole which penetrates through the main board 2. The through hole 21 is also referred to as a penetrating via. For example, a hole is formed on the main board 2 by, for example, a drill machining, laser or a dry etching, and the copper plating is formed on the side walls of the hole of the main board 2 by, for example, an electroless plating method and an electrolytic plating method. The signal transmission path 22 includes wirings extending in the planar direction of the main board 2 and vias extending in the thickness direction of the main board 2. The signal transmission path 22 is a signal line used for transmitting the signal processed by the CPU 5.

The CPU 5 may be electrically connected with the through hole 21 through the solder ball 11 and the surface pattern 23. The CPU 5 may be electrically connected with the signal transmission path 22 through the solder ball 11 and the electrodes (not illustrated) formed on the top surface of the main board 2.

With the surface mount technology (SMT), a plurality of pillars 4 is mounted on the bottom surface located on the opposite side of the top surface of the main board 2. The plurality of pillars 4 are arranged on the plurality of surface patterns 24 formed on the bottom surface of the main board 2, and the pillars 4 and the surface patterns 24 are soldered by a solder 25, such that the pillars 4 are mounted on the bottom surface of the main board 2. In this case, a single pillar 4 is arranged on a single surface pattern 24. The surface pattern 24 has conductivity and is formed by using, for example, the copper foil.

Figure 2:
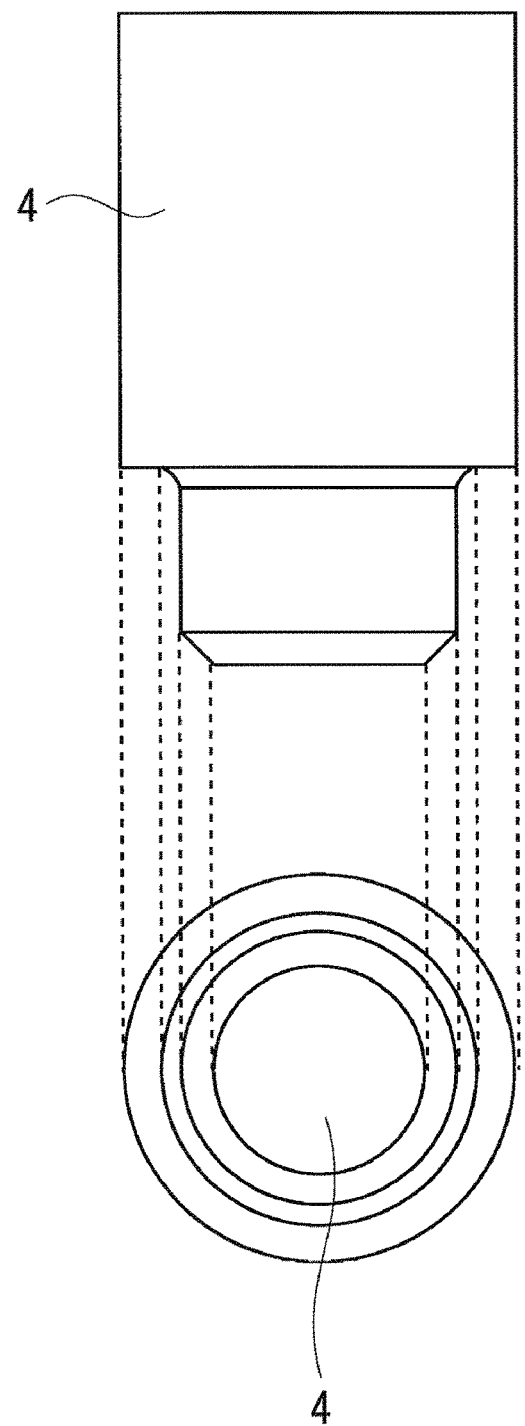
FIG. 2 is a diagram illustrating an outer appearance of a pillar.

The through holes 21 and the surface pattern 24 are electrically connected with each other and the surface pattern 24 and the pillar 4 are electrically connected with each other. The pillar 4 is connected to the power board 3. The pillar 4 has conductivity and is formed by using, for example, copper. The pillar 4 is an example of a conductor. FIG. 2 is a diagram of an outer appearance of the pillar 4 and illustrates the side surfaces and the bottom surface of the pillar 4. The pillar 4 includes a first portion and a second portion which is thinner than the first portion.

The power board 3 is arranged at a position distant from the bottom surface of the main board 2 and includes a plurality of DC/DC converters 6. The power board 3 is formed by, for example, a plurality of resin layers. The plurality of DC/DC converters 6 are mounted on the bottom surface of the power board 3. The DC/DC converter 6 is an example of a power supply device. The plurality of DC/DC converters 6 may be mounted on the top surface located on an opposite side to the bottom surface of the power board 3. The CPU 5 and the DC/DC converter 6 are electrically connected with each other and power (power supply) is supplied from the DC/DC converter 6 to the CPU 5 through the plurality of pillars 4 and the plurality of through holes 21. For example, the DC/DC converter 6 drops a voltage supplied from an external power supply to a voltage for the CPU 5 and supplies the power to the CPU 5.

Figure 9:
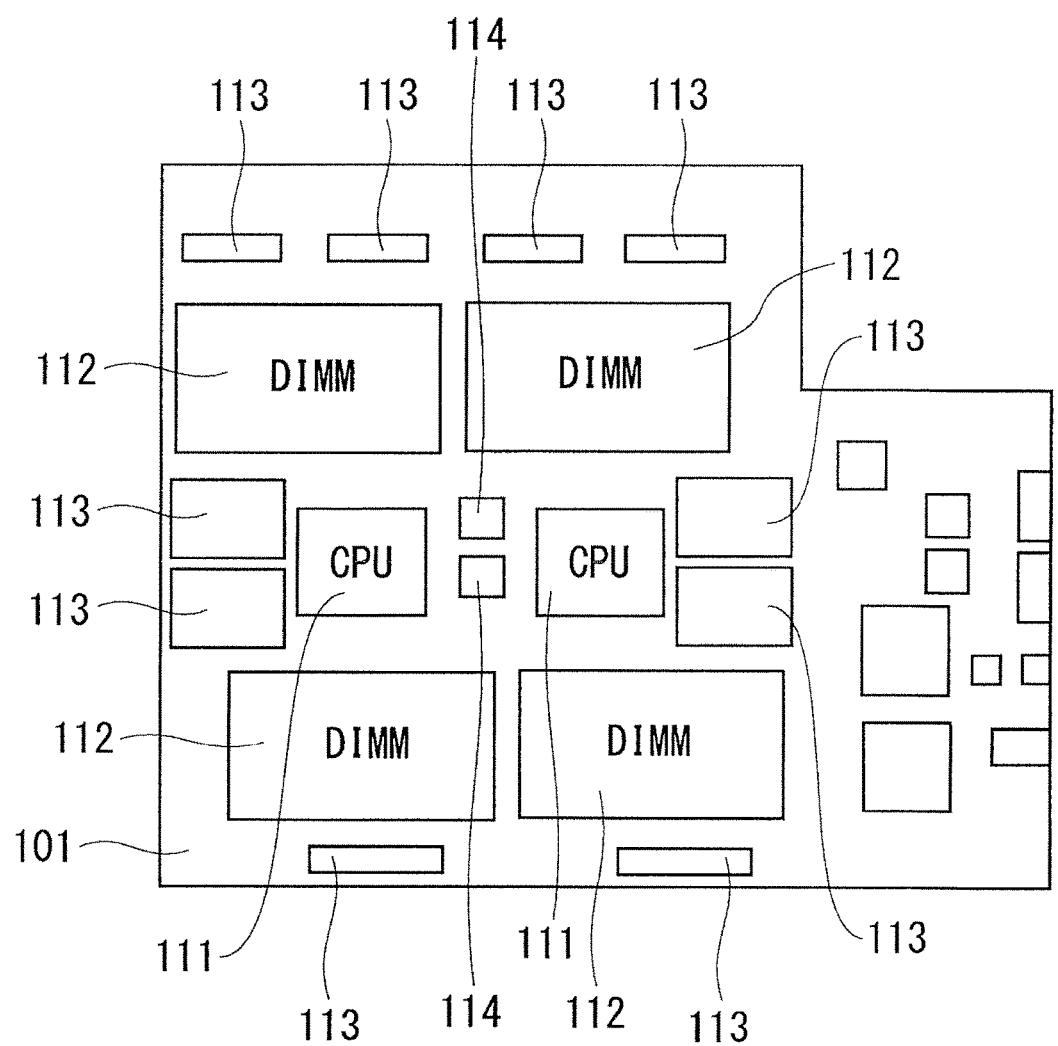
FIG. 9 is a plan view of a board.
Figure 10:
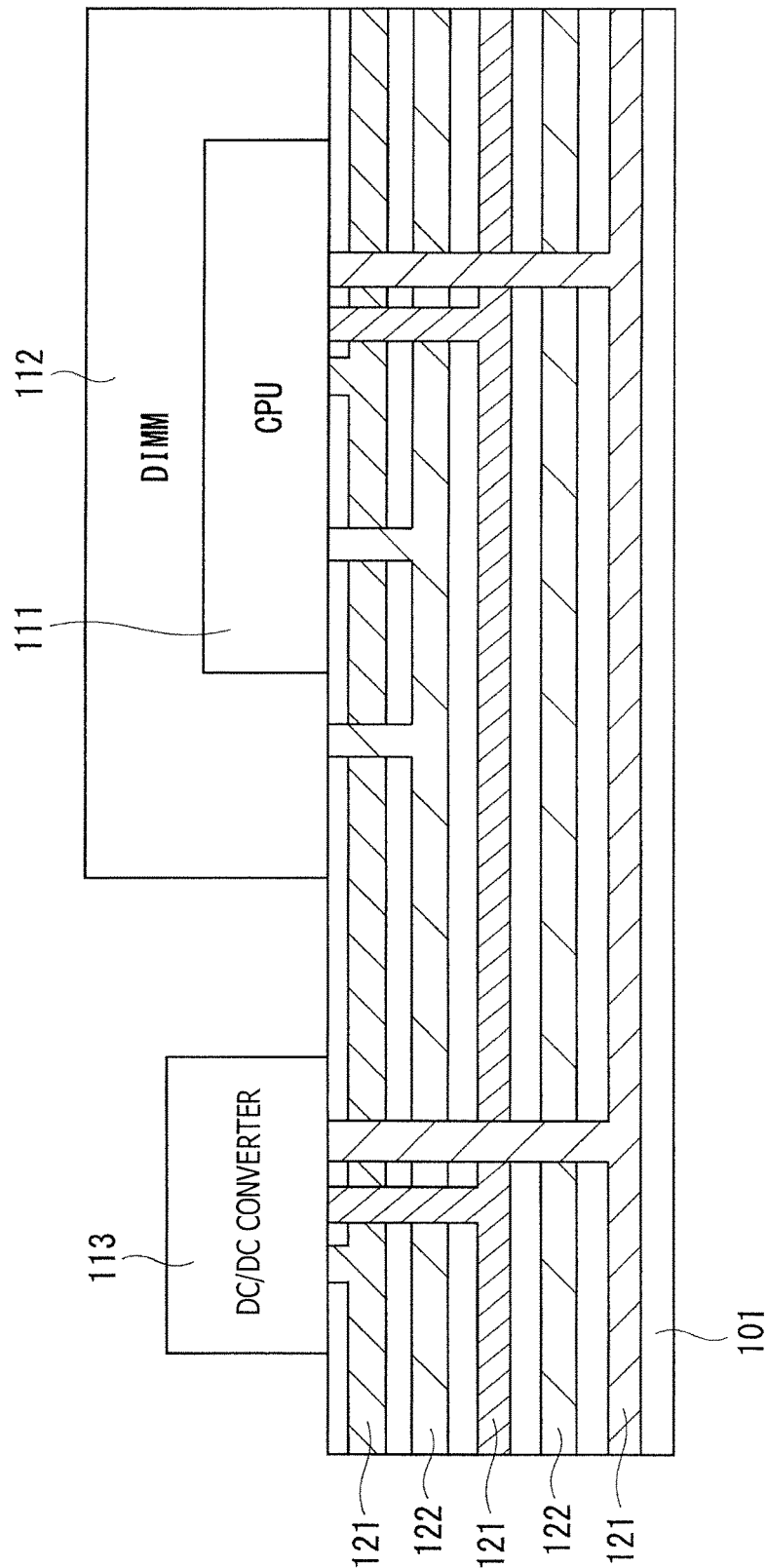
FIG. 10 is a partial cross sectional view of the board.
Figure 11:
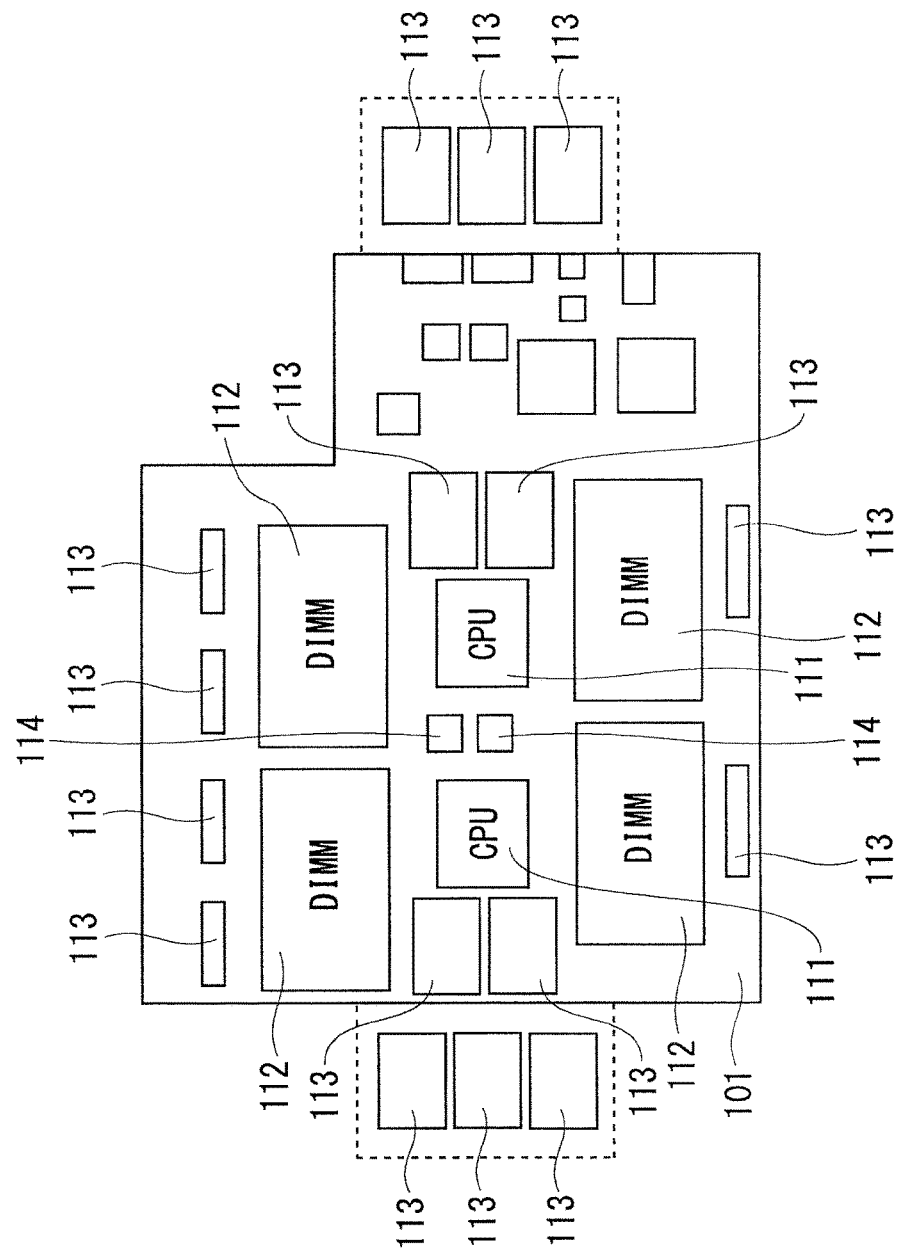
FIG. 11 is another plan view of the board.
Figure 12A:
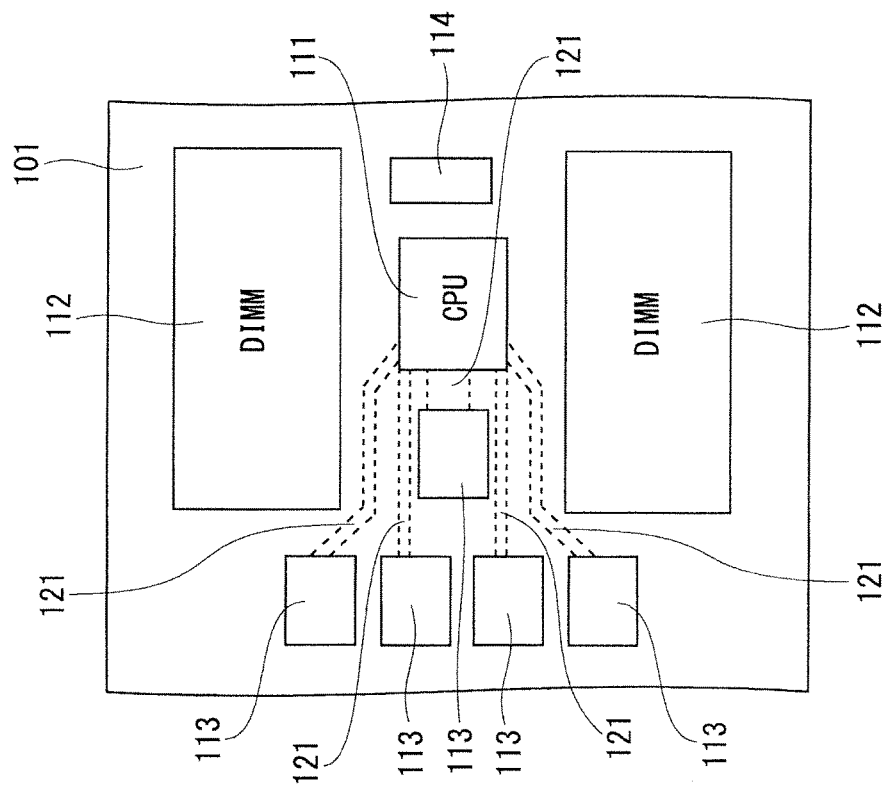
FIG. 12A is a plan view of the board before power feeding paths are added.
Figure 12B:
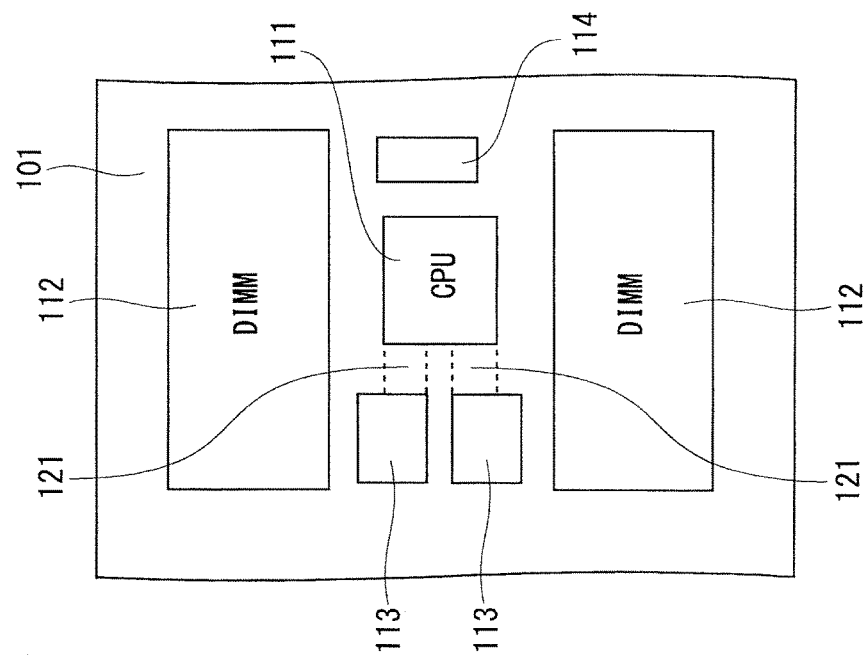
FIG. 12B is a plan view of the board after power feeding paths are added.

As illustrated in FIG. 9 and FIG. 10, when the CPU 111 and the DC/DC converter 113 are arranged on the same plane of the board 101, the power feeding path 121 extending from the DC/DC converter 113 to the CPU 111 is formed in the board 101 while avoiding the signal transmission path 122. Accordingly, the power feeding path 121 extending from the DC/DC converter 113 to the CPU 111 becomes longer.

In the power supply board 1, the plurality of pillars 4 are arranged on the bottom surface of the main board 2. That is, the power feeding path extending from the DC/DC converter 6 to the CPU 5 is formed in a vertical direction of the main board 2. Accordingly, the power feeding path extending from the DC/DC converter 6 to the CPU 5 becomes shorter as compared with a case where the power feeding path is formed in a plane direction of the main board 2. In the power supply board 1, the power feeding path extending from the DC/DC converter 6 to the CPU 5 becomes shorter as compared with an architecture illustrated in FIG. 9 and FIG. 10. Accordingly, the voltage drop in the power feeding path extending from the DC/DC converter 6 to the CPU 5 may be suppressed according to the power supply board 1.

According to the power supply board 1, the plurality of pillars 4 are arranged on the bottom surface of the main board 2 such that the power feeding path between the main board 2 and the DC/DC converter 6 may be arranged outside of the main board 2. That is, a portion of the power feeding path extending from the DC/DC converter 6 to the CPU 5 may be arranged outside of the main board 2. Accordingly, the power supply noise in a power feeding path with respect to the signal transmission path 22 of the main board 2 may be reduced.

Figure 3:
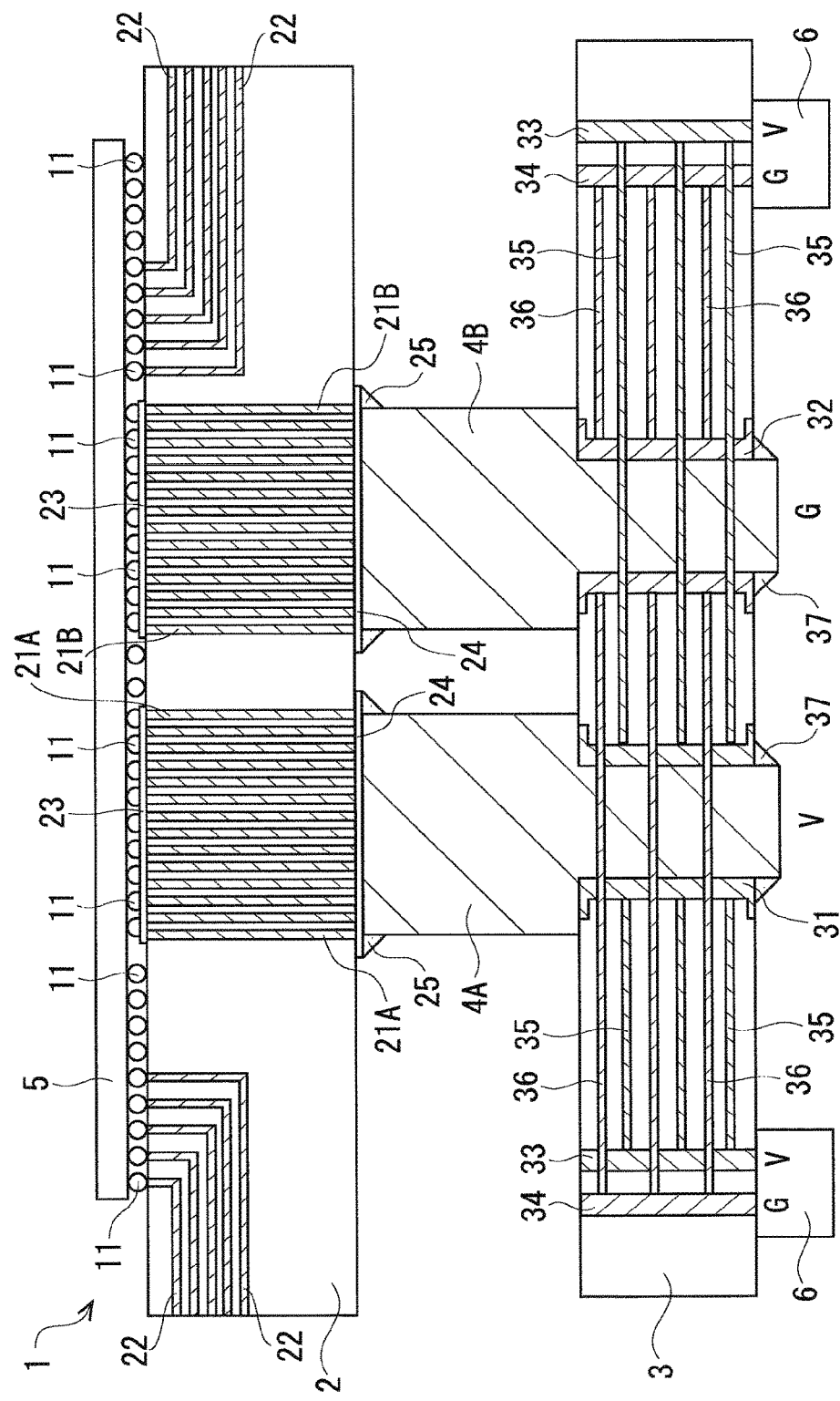
FIG. 3 is a schematic view of the power supply board.

FIG. 3 is a schematic view of the power supply board 1 and illustrates a detailed configuration of the power board 3. The power board 3 includes a plurality of through holes 31, 32, 33, and 34, a plurality of power supply wirings 35, and a plurality of ground wirings 36 that are formed inside thereof. In FIG. 3, one of the plurality of pillars 4 is illustrated as a pillar 4A and another one of the plurality of pillars 4 is illustrated as a pillar 4B. The pillar 4A is an example of a first conductor. The pillar 4B is an example of a second conductor. In FIG. 3, the through hole 21 electrically connected with the pillar 4A is illustrated as a through hole 21A and the through hole 21 electrically connected with the pillar 4B is illustrated as a through hole 21B. The through hole 21A is an example of a first through hole. The through hole 21B is an example of a second through hole.

The through holes 31, 32, 33, and 34 include a hole penetrating through the power board 3 and copper plating formed on the side walls of the hole penetrating through the power board 3, respectively. For example, a hole is formed on the power board 3 by, for example, a drill machining, laser or a dry etching, and the copper plating is formed on the side walls of the hole by, for example, an electroless plating method and an electrolytic plating method.

The pillars 4A, 4B are mounted on the power board 3 by a flow soldering (DIP) method. The second portion of the pillar 4A is inserted into the hole of the through hole 31 and the second portion of the pillar 4B is inserted into the hole of the through hole 32. The bottom surface of the power board 3 is immersed into the molten solder, the pillar 4A and the through hole 31 are soldered by the solder 37, and the pillar 4B and the through hole 32 are soldered by the solder 37, such that the pillars 4A and 4B are mounted on the power board 3. The solder 37 is introduced into a gap between the pillar 4A and the through hole 31 such that the pillar 4A and the through hole 31 are joined with each other. The solder 37 is introduced into a gap between the pillar 4B and the through hole 32 such that the pillar 4B and the through hole 32 are joined with each other.

The DC/DC converter 6 is electrically connected with the through holes 33 and 34. The through hole 33 is electrically connected with the power supply wiring 35 and the through hole 34 is electrically connected with the ground wiring 36. The power supply wiring 35 is electrically connected with the through hole 31. The ground wiring 36 is electrically connected with the through hole 32. The through hole 31 is electrically connected with the pillar 4A. The through hole 32 is electrically connected with the pillar 4B. A power feeding path extending from the DC/DC converter 6 to the CPU 5 is formed by the solder ball 11, the surface pattern 23, the through holes 21A and 21B, the surface pattern 24, the pillars 4A and 4B, the through holes 31, 32, 33, and 34, the power supply wiring 35, and the ground wiring 36. The power feeding path extending from the DC/DC converter 6 to the CPU 5 includes a power supply path between the CPU 5 and the DC/DC converter 6 and a ground path between the CPU 5 and the DC/DC converter 6.

As illustrated in FIG. 3, the pillar 4A is arranged just below a plurality of through holes 21A and the pillar 4B is arranged just below a plurality of through holes 21B. Accordingly, the power feeding path between the main board 2 and the DC/DC converter 6 may be arranged just below the through holes 21A and 21B. Accordingly, the power supply noise in the power feeding path with respect to the signal transmission path 22 of the main board 2 may be reduced.

Figure 4:
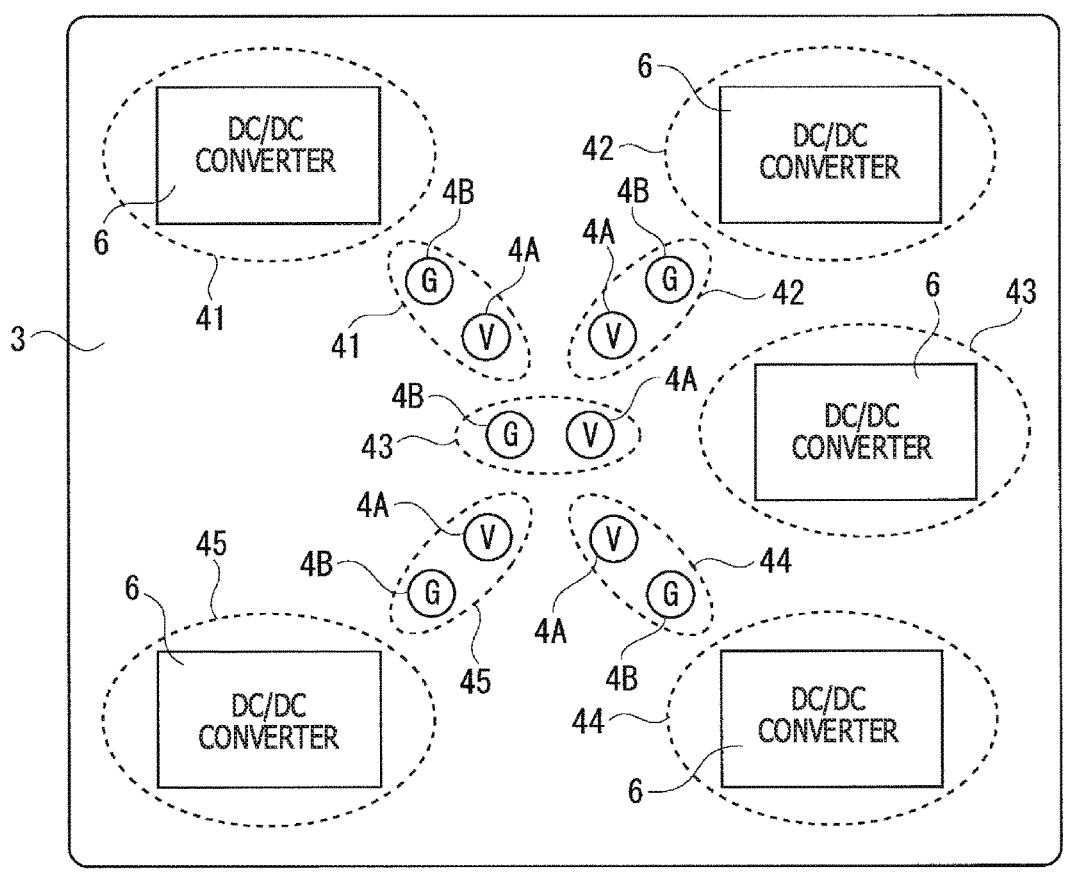
FIG. 4 is a block diagram illustrating a power supply system of the power supply board.

FIG. 4 is a block diagram illustrating a power supply system of the power supply board 1. As illustrated in FIG. 4, the pillars 4A and 4B are arranged at the central portion of the power board 3 and the DC/DC converters 6 are arranged at an outer periphery outside of the central portion of the power board 3. A single pillar 4A and a single pillar 4B are formed as one set, and the pillar 4A is used for a power source connection and the pillar 4B is used for a ground connection. That is, the pillar 4A is used as a portion of the power supply path between the CPU 5 and the DC/DC converter 6 and the pillar 4B is used as a portion of the ground path between the CPU 5 and the DC/DC converter 6. The pillar 4A may be used for the ground connection and the pillar 4B may be used for the power source connection without being limited to the example illustrated in FIG. 4.

The pillars 4A and 4B and the DC/DC converter 6 surrounded by the dotted line 41 belong to a first power supply system. The pillars 4A and 4B and the DC/DC converter 6 surrounded by the dotted line 42 belong to a second power supply system. The pillars 4A and 4B and the DC/DC converter 6 surrounded by the dotted line 43 belong to a third power supply system. The pillars 4A and 4B and the DC/DC converter 6 surrounded by the dotted line 44 belong to a fourth power supply system. The pillars 4A and 4B and the DC/DC converter 6 surrounded by the dotted line 45 belong to a fifth power supply system. The DC/DC converters 6 that belong to the first power supply system to the fifth power supply system may supply the power to the CPU 5 at different voltage values, respectively. Further, the DC/DC converters 6 that belong to the first power supply system to the fifth power supply system may supply the power to the CPU 5 at the same voltage value, respectively.

Although an example of a case in which the number of power supply systems is 5 (five) is illustrated in FIG. 4, the number of power supply systems is not limited to the example of FIG. 4 and the number of power supply systems may be varied according to the specification of the CPU 5. Further, a plurality of DC/DC converters 6 may belong to a single power supply system. In the example of FIG. 3, for example, the plurality of DC/DC converters 6 belong to a single power supply system, a single pillar 4A and the plurality of DC/DC converters 6 are electrically connected with each other, and a single pillar 4B and the plurality of DC/DC converters 6 are electrically connected with each other.

Figure 5:
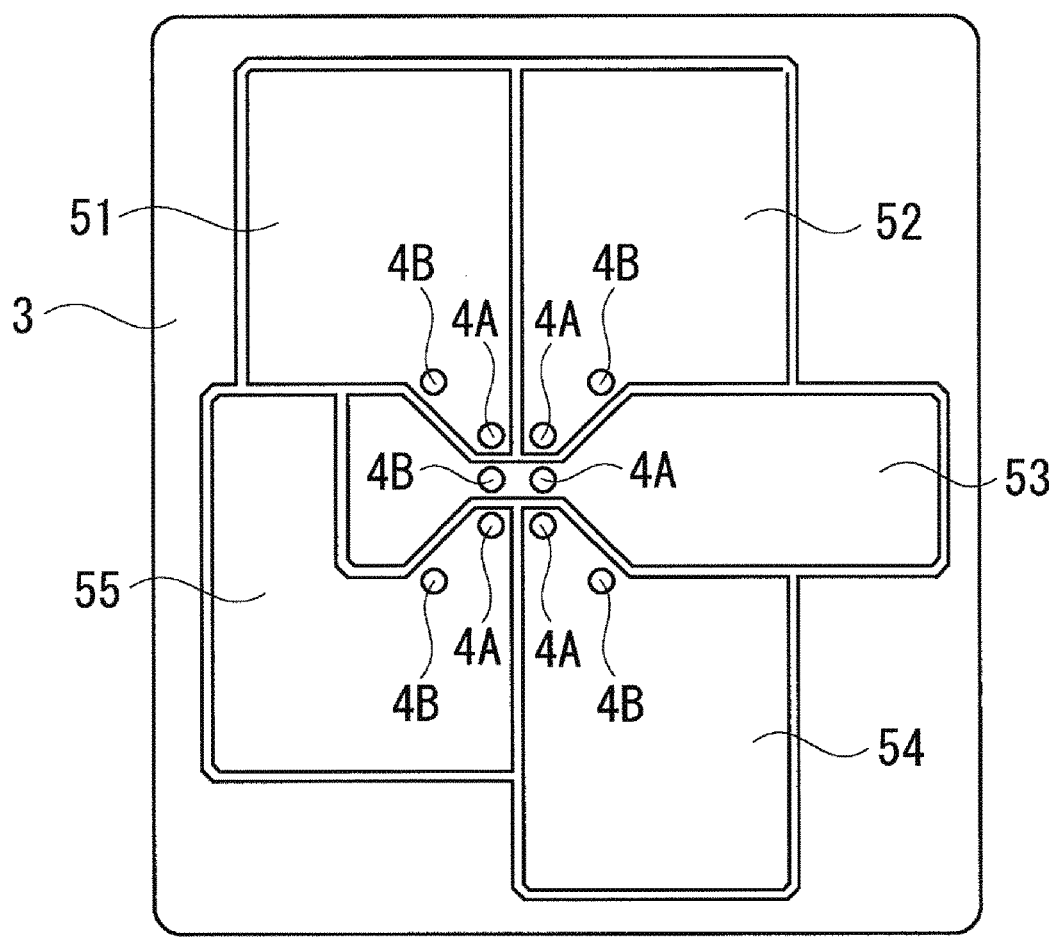
FIG. 5 is a diagram illustrating a wiring pattern in an inner layer of a power board.

FIG. 5 is a diagram illustrating a wiring pattern in an inner layer of the power board 3. The wiring pattern includes a pattern of the power supply wiring 35 and a pattern of the ground wiring 36. As illustrated in FIG. 5, the inner layer of the power board 3 is sectioned (partitioned) into areas 51 to 55 and the wiring patterns that belong to the first power supply system to the fifth power supply system are arranged at the areas 51 to 55, respectively. The arrangements of the area 51 to the area 55 correspond to the arrangements of respective DC/DC converters 6 that belong to the first power supply system to fifth power supply system. That is, the wiring patterns that belong to the first power supply system to the fifth power supply system are arranged just below the respective DC/DC converters 6 that belong to the first power supply system to the fifth power supply system. Since only the power supply components (the DC/DC converter 6 and relevant components) are mounted on the power board 3, the mounting of the power supply component and the wiring pattern in the inner layer of the power board 3 may be efficiently designed.

A single pillar 4A may be electrically connected with a single DC/DC converter 6. Accordingly, the power supply voltage may be supplied from the single DC/DC converter 6 to the CPU 5 through the single pillar 4A and a plurality of through holes 21A. Further, the single pillar 4A may be electrically connected with the plurality of DC/DC converters 6. Accordingly, the power supply voltage may be supplied from the plurality of DC/DC converters 6 to the CPU 5 through the single pillar 4A and the plurality of through holes 21A.

A single pillar 4B may be electrically connected with a single DC/DC converter 6. Accordingly, the ground voltage may be supplied from the single DC/DC converter 6 to the CPU 5 through the single pillar 4B and a plurality of through holes 21B. Further, the single pillar 4B may be electrically connected with the plurality of DC/DC converters 6. Accordingly, the ground voltage may be supplied from the plurality of DC/DC converters 6 to the CPU 5 through the single pillar 4B and the plurality of through holes 21B.

The signal transmission path 22 is not formed on the power board 3. Therefore, the wiring pattern formed in the inner layer of the power board 3 is not affected by the arrangement of the signal transmission path 22. That is, all of the inner layers of the power board 3 may be utilized as the power feeding path. Since the power supply wiring 35 and the ground wiring 36 are not formed on the main board 2, the power supply noise in the power feeding path with respect to the signal transmission path 22 of the main board 2 may be reduced.

The CPU 5 is mounted on the top surface of the main board 2. Therefore, a high degree of flatness is required for a joint surface of the main board 2 and the CPU 5. When the high degree of flatness is not maintained, the distance between the top surface of the main board 2 and the CPU 5 becomes uneven. In this case, a joined state between the solder ball 11 on the top surface of the main board 2 and the CPU 5 is deteriorated and thus, the power feeding to the CPU becomes unstable.

There may be a case where a through hole having a large diameter is formed in, for example, the main board 2 and the copper pillar or the copper coin is buried in the through hole so as to supply the power to the CPU 5. However, when the through hole having a large diameter is formed in the main board 2, a strain is generated in the main board 2 and thus, the flatness of the joint surface of the main board 2 and the CPU 5 is deteriorated. Further, when the pillar copper or the copper coin is buried in the main board 2, the manufacturing cost of the main board 2 increases. As described above, when the power is supplied to the CPU 5 under the situation where the pillar copper or the copper coin is buried in the main board 2, there is a huge disadvantage.

The through hole 21 provided in the main board 2 may be easily formed and even though a plurality of through holes 21 is formed in the main board 2, a strain or a warp is not generated in the main board 2. That is, the diameter of the through hole 21 is smaller than that of the pillar 4 and the diameter of the through hole 21 is adjusted so as not to generate a strain or a warp in the main board 2. Since a cross-sectional area of a single through hole 21 is small, the power supplied to the CPU 5 through a single through hole 21 is small. Accordingly, when a single solder ball 11 and a single through hole 21 are joined together, the power to be supplied to the CPU 5 may become insufficient.

In the power supply board 1, when the number of the through holes 21 is made greater than the number of the solder balls 11, it is possible to increase the power to be supplied to the CPU 5. The surface pattern 23 is arranged at an interface (e.g., a joined portion) between the solder ball 11 and the through hole 21. Accordingly, a plurality of through holes 21 may be electrically connected to a single solder ball 11 to increase the power to be supplied to the CPU 5. Accordingly, in the power supply board 1, a large current may be supplied from the DC/DC converter 6 to the CPU 5 through a plurality of pillars 4 and a plurality of through holes 21.

The DC/DC converter 6 is arranged on the power board 3 in the power supply board 1. Accordingly, in a case where the number of the DC/DC converters 6 is increased due to the increase of power consumption of the CPU 5, the DC/DC converter 6 may be added without using the mounting area of the main board 2. Since the connection of the main board 2 and the pillar 4 is performed by the SMT, designing of the main board 2 and the pillar 4 is simplified. Further, since the cross-sectional area of the pillar 4 is large, the voltage drop may be suppressed in the power feeding path extending from the DC/DC converter 6 to the CPU 5.

Figure 6:
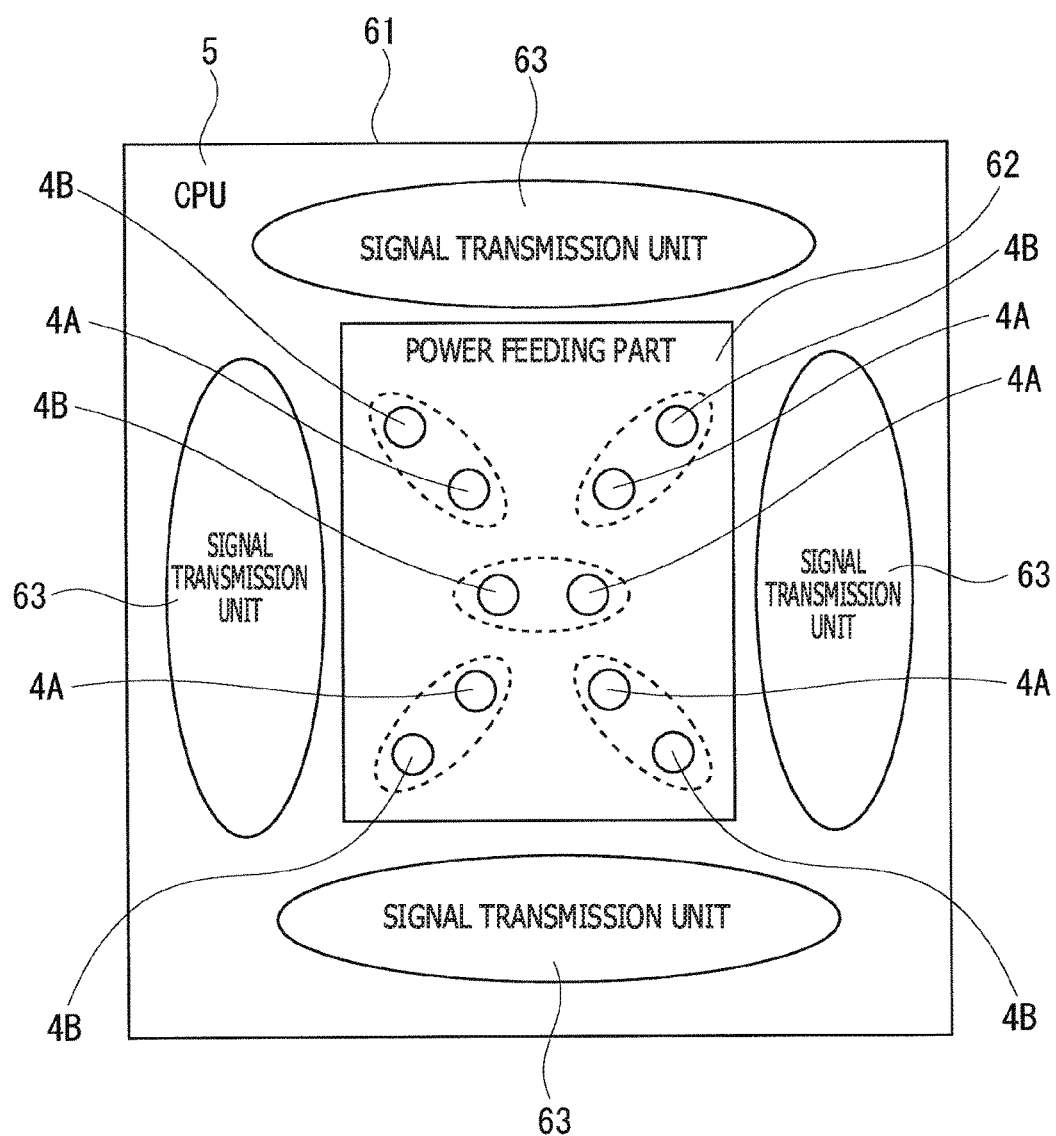
FIG. 6 is a diagram illustrating an interface between a main board and a CPU.

FIG. 6 is a diagram illustrating an interface between the main board 2 and the CPU 5. The rectangle 61 of FIG. 6 indicates a portion of an outer appearance of the CPU 5. The CPU 5 includes a power feeding part 62 and a plurality of signal transmission units 63. The power feeding part 62 supplies the power supplied from the DC/DC converter 6 to respective places of the CPU 5. The signal transmission unit 63 is connected with the signal transmission path 22 of the main board 2. The signal transmission unit 63 receives the signal from the signal transmission path 22 of the main board 2 and transmits the signal to the signal transmission path 22 of the main board 2.

As illustrated in FIG. 6, the power feeding part 62 is arranged in the central portion of the CPU 5 and the plurality of signal transmission units 63 are arranged in the outer periphery outside of the central portion of the CPU 5. That is, the power feeding part 62 and the plurality of signal transmission units 63 are arranged to be separated from each other. The pillars 4A and 4B are arranged just below the central portion of the CPU 5 and the signal transmission path 22 of the main board 2 is arranged just below the outer periphery of the CPU 5. Accordingly, the signal transmission path 22 of the main board 2 and the power feeding path extending from the DC/DC converter 6 to the CPU 5 may be separated such that the power supply noise in a power feeding path with respect to the signal transmission path 22 of the main board 2 may be reduced.

Embodiment 2

Figure 7:
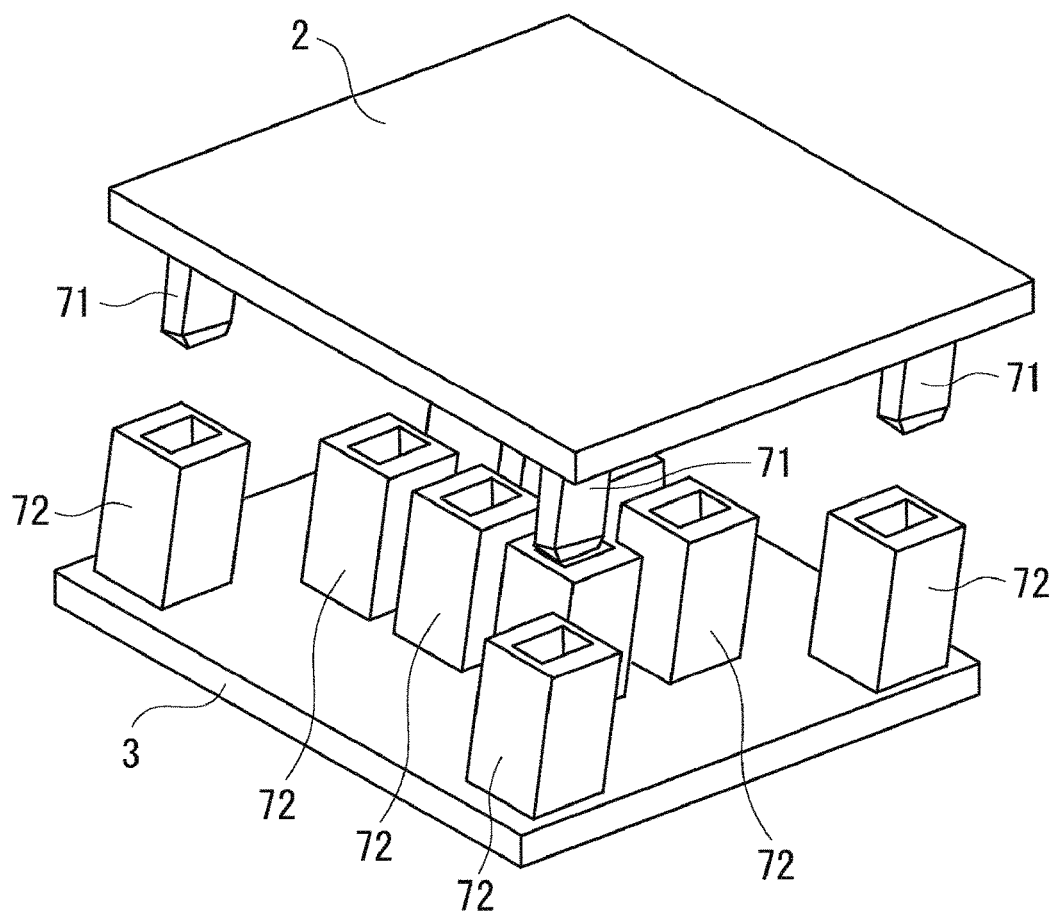
FIG. 7 is a diagram for explaining a connection method between the main board and the power board.
Figure 8:
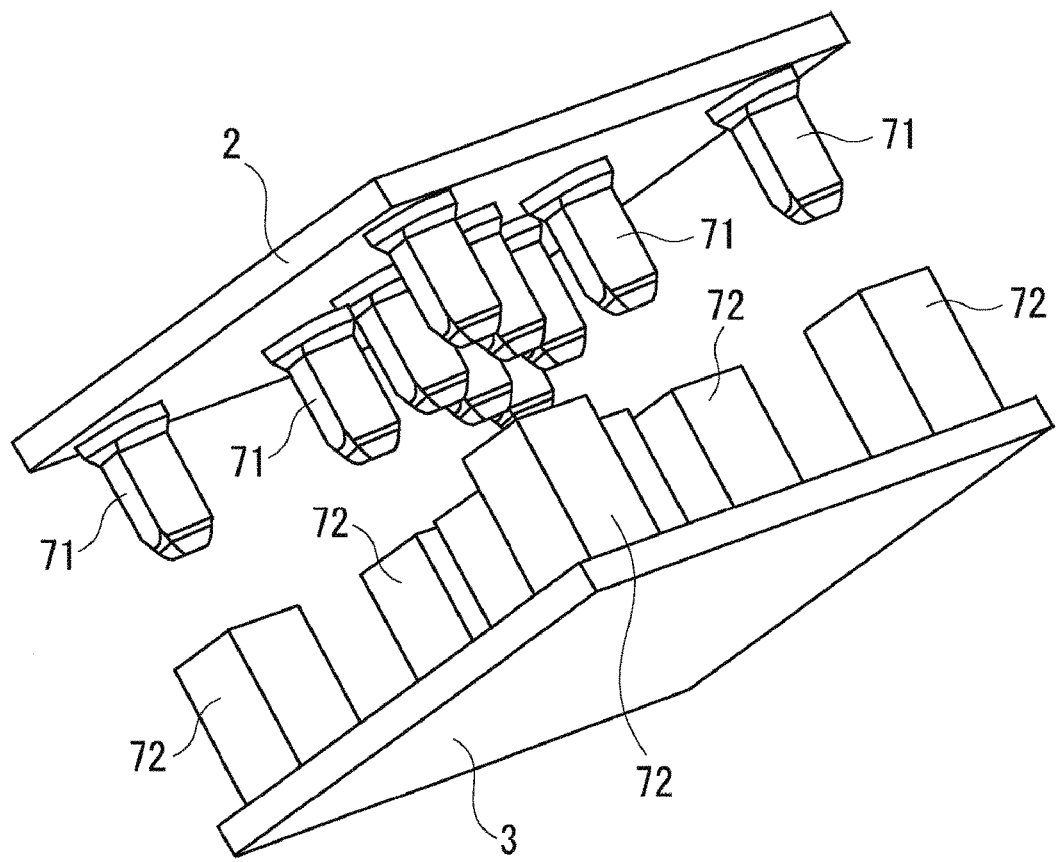
FIG. 8 is a diagram for explaining another connection method between the main board and the power board.

Descriptions will be made on the power supply board 1 according to Embodiment 2. In the power supply board 1 according to Embodiment 2, the main board 2 and the power board 3 are connected by a connector. FIG. 7 and FIG. 8 are diagrams for explaining a connection method between the main board 2 and the power board 3. A plurality of first connectors 71 is provided in the main board 2 for the replacement of plurality of pillars 4. With the SMT, the plurality of first connectors is mounted on the bottom surface of the main board 2.

A plurality of second connector 72 is provided in the power board 3. The second connector 72 is coupled to (fitted with) the first connector 71. The first connector 71 is, for example, a male connector. The second connector 72 is, for example, a female connector. The first connector 71 and the second connector 72 are formed by using, for example, a copper. Without being limited to the example illustrated in FIG. 7 and FIG. 8, the first connector 71 may be the female connector and the second connector 72 may be the male connector.

When the pillar 4 is mounted on the power board 3 by the DIP method, the solder 37 is re-melted to extract the pillars 4 from the through holes 31 and 32 in order to remove the pillars 4 from the power board 3. Accordingly, unnecessary thermal load is applied on the power supply board 1. When the main board 2 and the power board 3 are connected by the first connector 71 and the second connector 72, the main board 2 and the power board 3 may be easily separated from each other. Accordingly, it becomes easy to repeat connecting and separating of the main board 2 and the power board 3 such that maintainability of the power supply board 1 is improved.

Figure 13:
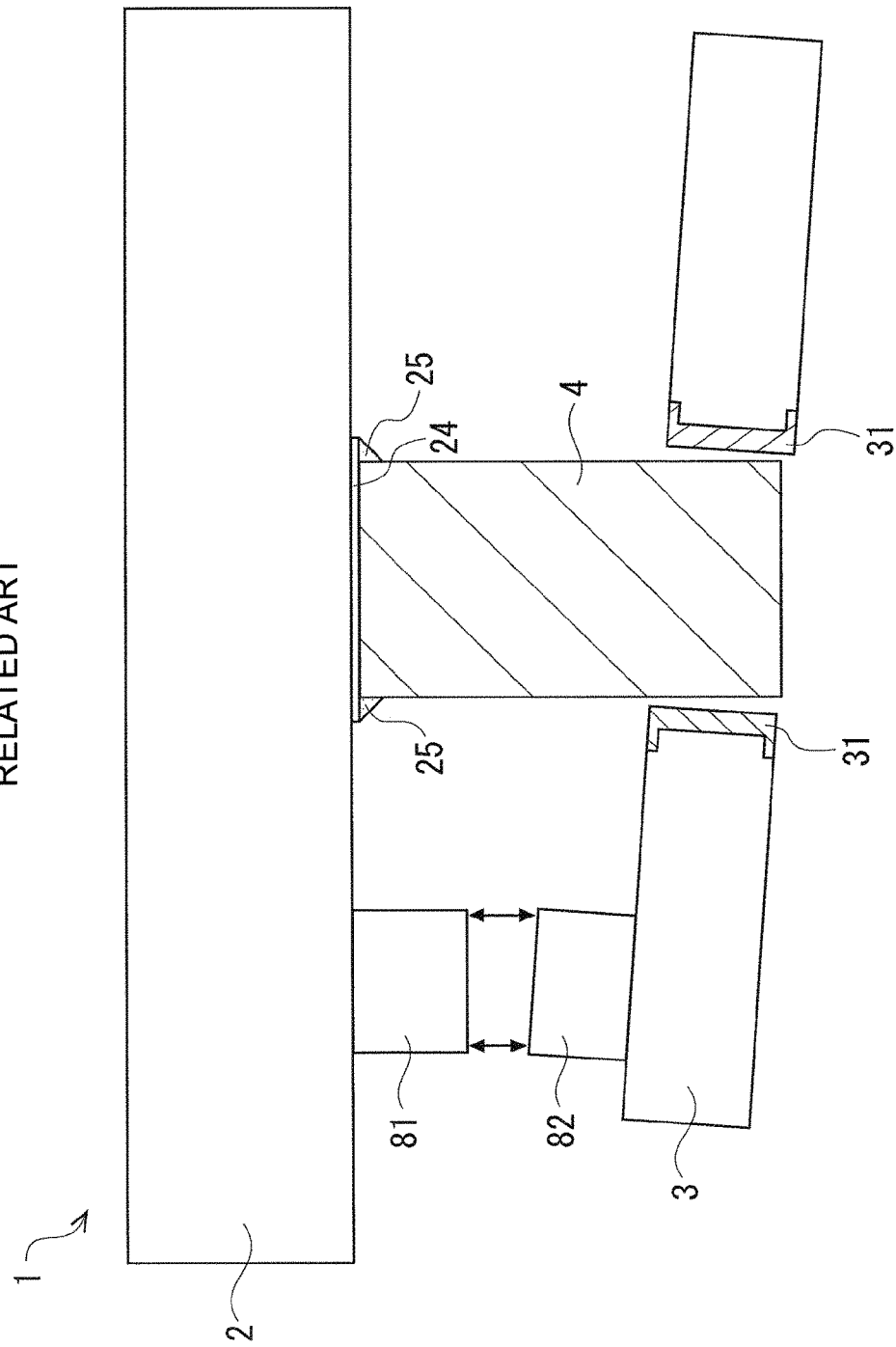
FIG. 13 is another schematic view of the power supply board.

For example, in a case where the pillar 4 has a columnar shape in its entirety, as illustrated in FIG. 13, there is a problem that the distance between the main board 2 and the power board 3 is not determined, positioning of the power board 3 becomes difficult, or positioning of the power board 3 may not be performed. Further, when the diameter of the through hole 31 is large, there is a problem that the power board 3 is not parallel with the main board 2 and the distance between an electronic component 81 such as a capacitor mounted on the main board 2 and an electronic component 82 such as a capacitor mounted on the power board 3 is not constant. The distance between the electronic component 81 of the main board 2 and the electronic component 82 of the power board 3 varies depending on the distance between the main board 2 and the power board 3. When the main board 2 and the power board 3 are approaching too close to each other, the electronic component 81 of the main board 2 and the electronic component 82 of the power board 3 may come into contact with each other.

In the power supply board 1 according to Embodiment 1, the pillar 4A is provided with a first portion having a first diameter and with a second portion having a second diameter. The first portion and the second portion of the pillar 4A have the columnar shape and are connected with each other. The diameter of the first portion of the pillar 4A is larger than the diameter of the second portion of the pillar 4A.

Figure 14:
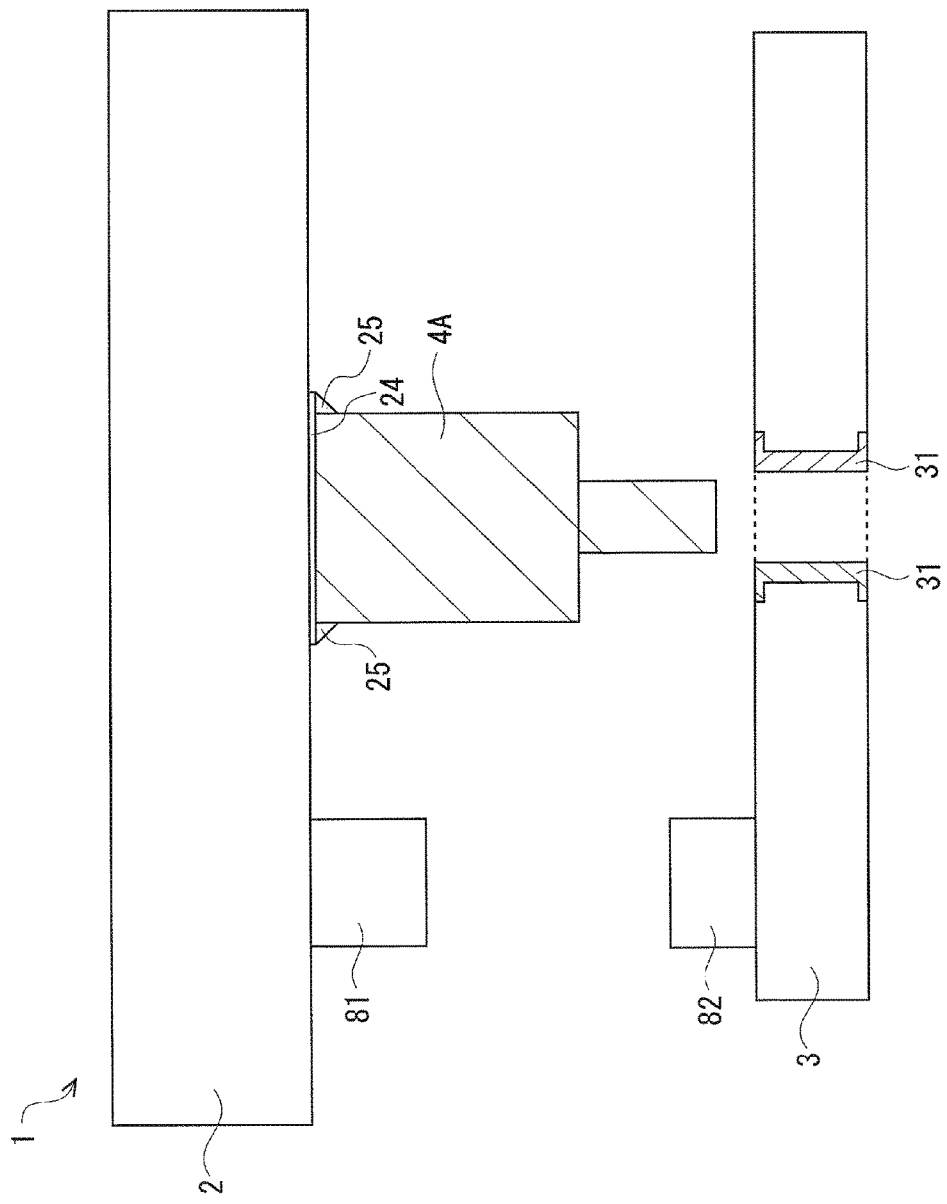
FIG. 14 is a schematic view of the power supply board before the pillar is mounted on the power board.

As illustrated in FIG. 14, the first portion of the pillar 4A is mounted on the main board 2 in a state where an end face of the first portion of the pillar 4A is in contact with the surface pattern 24. FIG. 14 is a schematic view of the power supply board 1 before the pillar 4A is mounted on the power board 3. The end face of the second portion of the pillar 4A orients toward the power board 3. Since the diameter of the first portion of the pillar 4A is larger than the diameter of the second portion of the pillar 4A, the pillar 4A has a stepped shape. In other words, the pillar 4A has a shape in which a central portion of one end face of the pillar 4 is protruded. The electronic component 81 is mounted on the bottom surface of the main board 2 and the electronic component 82 is mounted on the top surface of the power board 3.

Figure 15:
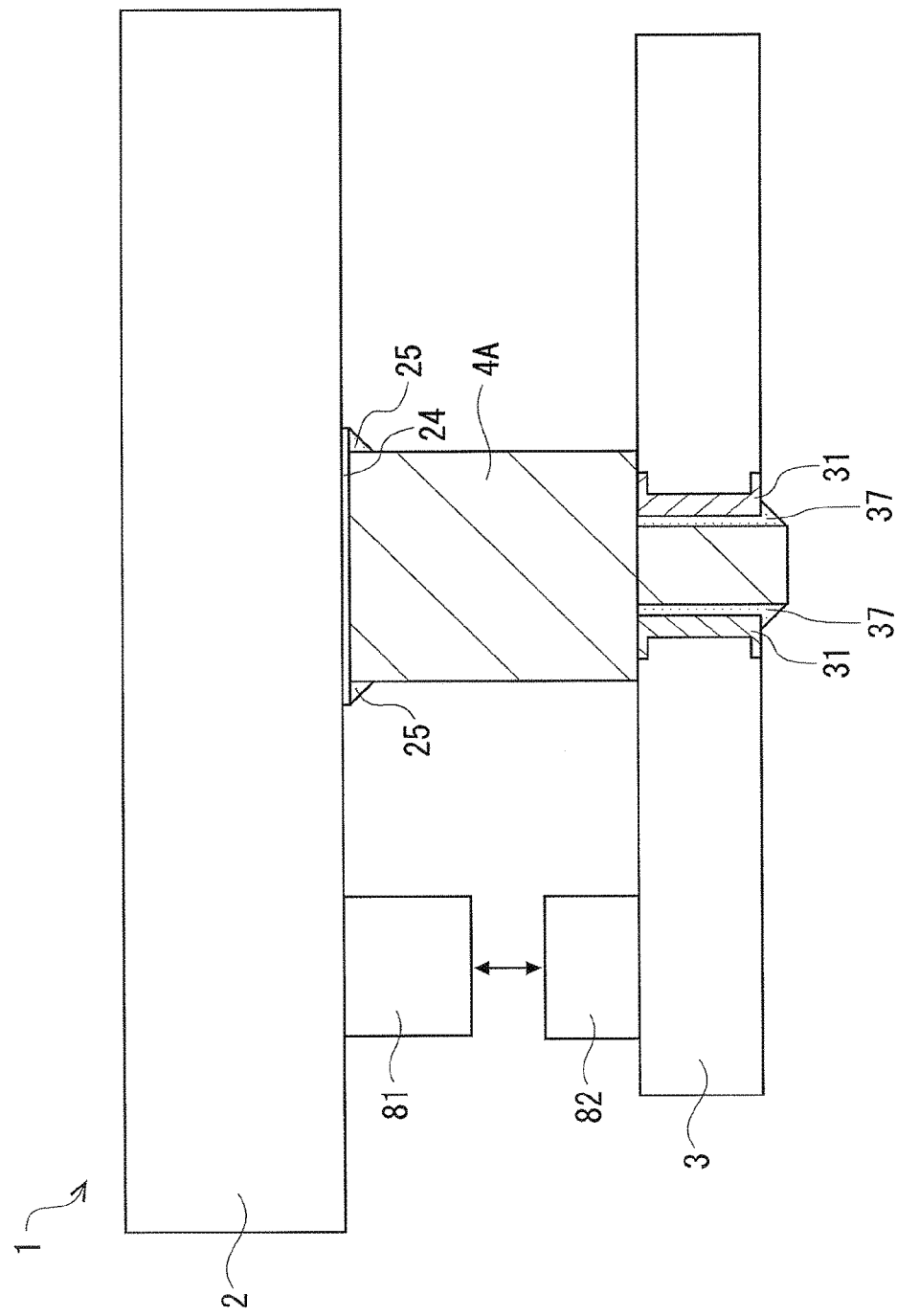
FIG. 15 is a schematic view of the power supply board in which the pillar is mounted on the power board.

FIG. 15 is a schematic view of the power supply board 1 in which the pillar 4A is mounted on the power board 3. As illustrated in FIG. 15, the first portion of the pillar 4A is located between the main board 2 and the power board 3, and the second portion of the pillar 4A is located inside of the power board 3. The pillar 4A has the stepped shape such that the first portion of the pillar 4A comes in contact with the top surface of the power board 3 and the second portion of the pillar 4A is inserted into the hole of the through hole 31 penetrating through the power board 3. The through hole 31 is an example of a third through hole. The hole of the through hole 31 is circular when viewed from the top. Since the diameter of the second portion of the pillar 4A is smaller than the diameter of the hole of the through hole 31, a gap (space) is formed between the second portion of the pillar 4A and the through hole 31. The solder 37 is formed in the gap between the second portion of the pillar 4A and the through hole 31 such that the second portion of the pillar 4A is joined with the through hole 31.

Due to the stepped shape of the pillar 4A, the power board 3 is maintained to be located at a predetermined position (a position distant from the main board 2 by a predetermined length). That is, the first portion of the pillar 4A and the top surface of the power board 3 come in contact with each other and the second portion of the pillar 4A is joined with the through hole 31, such that the power board 3 is maintained to be located at a predetermined position. Since the diameter of the first portion of the pillar 4A is larger than the diameter of the through hole 31, the first portion of the pillar 4A and the top surface of the power board 3 come in contact with each other. When the first portion of the pillar 4A and the top surface of the power board 3 come in contact with each other, the power board 3 becomes parallel to the main board 2 and the power board 3 is not inclined with respect to the main board 2. The power board 3 is maintained to be located at a predetermined position such that the distance between the electronic component 81 of the main board 2 and the electronic component 82 of the power board 3 becomes constant. In the power supply board 1 according to Embodiment 1, the position of the power board 3 may be easily determined and also the distance between the main board 2 and the power board 3 may be maintained constant. Accordingly, the distance between the electronic component 81 of the main board 2 and the electronic component 82 of the power board 3 may be maintained constant.

When the length of the first portion of the pillar 4A is changed, it becomes possible to adjust the distance between the main board 2 and the power board 3. When the length of the first portion of the pillar 4A is made greater than the total of a height of the electronic component 81 and a height of the electronic component 82, it is possible to avoid contact between the electronic component 81 and the electronic component 82.

In FIG. 14 and FIG. 15, the pillar 4A is illustrated and the pillar 4B is not illustrated, but the pillar 4B may have the same configuration as the pillar 4A. That is, the pillar 4B may be provided with a first portion having a first diameter and a second portion having a second diameter. The first portion and the second portion of the pillar 4B have the columnar shape and are connected with each other. The diameter of the first portion of the pillar 4B is larger than the diameter of the second portion of the pillar 4B. Since the diameter of the first portion of the pillar 4B is larger than the diameter of the second portion of the pillar 4B, the pillar 4B has a stepped shape. In other words, the pillar 4B has a shape in which a central portion of one end face of the pillar 4B is protruded. When the pillar 4B is mounted on the power board 3, the first portion of the pillar 4B is located between the main board 2 and the power board 3, and the second portion of the pillar 4B is located inside of the power board 3.

The pillar 4B has the stepped shape such that the first portion of the pillar 4B comes in contact with the top surface of the power board 3 and the second portion of the pillar 4B is inserted into the hole of the through hole 32 penetrating through the power board 3. The through hole 32 is an example of a fourth through hole. The hole of the through hole 32 is circular when viewed from the top. Since the diameter of the second portion of the pillar 4B is smaller than the diameter of the hole of the through hole 32, the gap (space) is formed between the second portion of the pillar 4B and the through hole 32. The solder 37 is formed in a gap between the second portion of the pillar 4B and the through hole 32 such that the second portion of the pillar 4B is joined with the through hole 32. The first portion of the pillar 4B and the top surface of the power board 3 come in contact with each other and the second portion of the pillar 4B is joined with the through hole 32, such that the power board 3 is maintained to be located at a predetermined position. Since the diameter of the first portion of the pillar 4B is larger than the diameter of the through hole 32, the first portion of the pillar 4B and the top surface of the power board 3 come in contact with each other.

One of the pillar 4A and the pillar 4B may have the stepped shape or both of the pillar 4A and the pillar 4B may have the stepped shape. When at least one of the pillars 4A and 4B has the stepped shape, the power board 3 is maintained to be located at a predetermined position such that the distance between the main board 2 and the power board 3 may be maintained constant. When both of the pillars 4A and 4B have the stepped shape, the accuracy of the parallelism of the power board 3 to the main board 2 is improved. Further, at least one of the plurality of pillars 4A may have the stepped shape and otherwise, all of the plurality of pillars 4A may have the stepped shape. When two or more pillars 4A among the plurality of pillars 4A have the stepped shape, the accuracy of the parallelism of the power board 3 to the main board 2 is improved. Furthermore, at least one pillar 4B among the plurality of pillars 4B may have the stepped shape and otherwise, all of the plurality of pillars 4B may have the stepped shape. When two or more pillars 4B among the plurality of pillars 4B have the stepped shape, the accuracy of the parallelism of the power board 3 to the main board 2 is improved.

Embodiment 3

As illustrated in FIG. 1, since the power is supplied from the DC/DC converter 6 to the CPU 5 through the pillar 4, a large current may be supplied from the DC/DC converter 6 to the CPU 5. The power generated by the DC/DC converter 6 passes through the wiring pattern in the inner layer of the power board 3, the outer peripheral surface of the pillar 4 and the inside of the pillar 4, and is then supplied to the CPU 5. The through hole 21 for supplying the power from the pillar 4 to the CPU 5 is formed in the main board 2. The plurality of through holes 21 is formed in the main board 2 in order to supply a large current to the CPU 5.

Since there is a limitation on the amount of electric current allowed to flow through a single through hole 21, the number of through holes 21 is increased in order to supply a large current to the CPU 5. When it is intended to allow the current flow from the pillar 4 to the plurality of through holes 21, since the pillar 4 and the plurality of through holes 21 are required to be abut on each other, the outer diameter of the pillar 4 becomes larger as the number of through holes 21 increases. In order to increase the strength of the solder 25 (solder joining part) joining the main board 2 and the pillar 4, it is effective to enlarge the joining area of the solder 25. When the outer diameter of the pillar 4 becomes larger, the joining area of the solder 25 is enlarged.

In the meantime, when the outer diameter of the pillar 4 is made larger, the rigidity of the pillar 4 becomes higher. When the rigidity of the pillar 4 becomes higher, the crack (fissure) occurs in the solder 25 joining the main board 2 and the pillar 4 for the following reasons.

Figure 16:
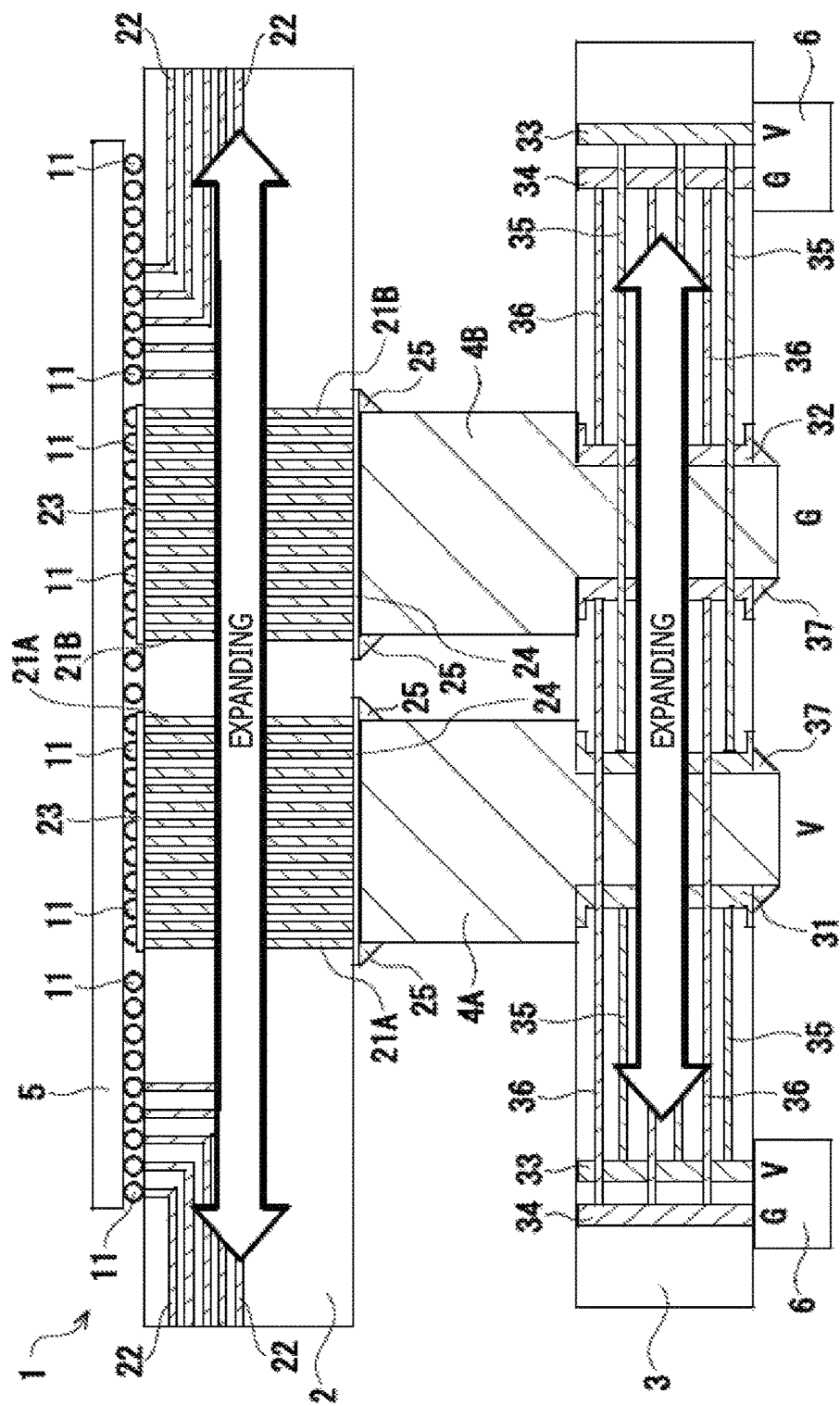
FIG. 16 is a schematic view of the power supply board in which the main board and the power board have been expanded.

When a power supply of the server apparatus provided with the power supply board 1 is turned ON and the server apparatus is activated, the temperature of the inside of the server apparatus is increased, and when the power supply of the server apparatus is turned OFF and the server apparatus is stopped, the temperature of the inside of the server apparatus is decreased. When the temperature of the inside of the server apparatus is increased, the main board 2 and the power board 3 expand, and when the temperature of the inside of the server apparatus is decreased, the main board 2 and the power board 3 are contracted. FIG. 16 is a schematic view of the power supply board 1 in a case where the server apparatus becomes an activation state such that the main board 2 and the power board 3 have been expanded.

Figure 17:
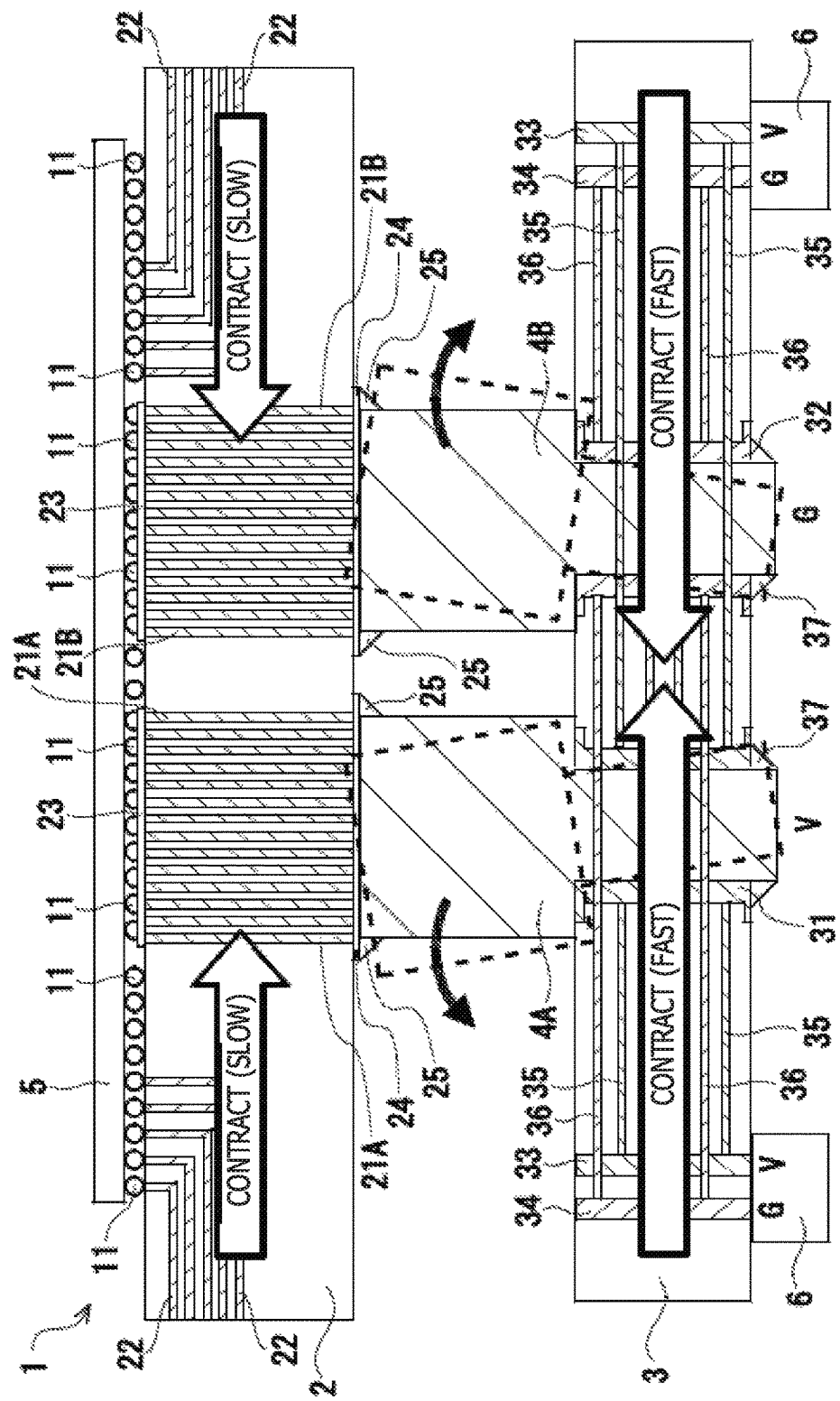
FIG. 17 is a schematic view of the power supply board in which a contraction speed of the power board is faster than that of the main board.

The thermal expansion coefficient of the main board 2 and the thermal expansion coefficient of the power board 3 differ from each other depending on the board characteristics (e.g., a material, a type, a thickness, the number of inner layers of the board). Therefore, the contraction speed of the main board 2 and the contraction speed of the power board 3 differ from each other. For example, when the contraction speed of the power board 3 is faster than that of the main board 2, the pillars 4A and 4B mounted on the main board 2 and the power board 3 follow the behavior of each of the main board 2 and the power board 3 such that a stress is generated around the pillars 4A and 4B. FIG. 17 is a schematic view of the power supply board 1 in a case where the contraction speed of the power board 3 is faster than that of the main board 2.

Figure 18:
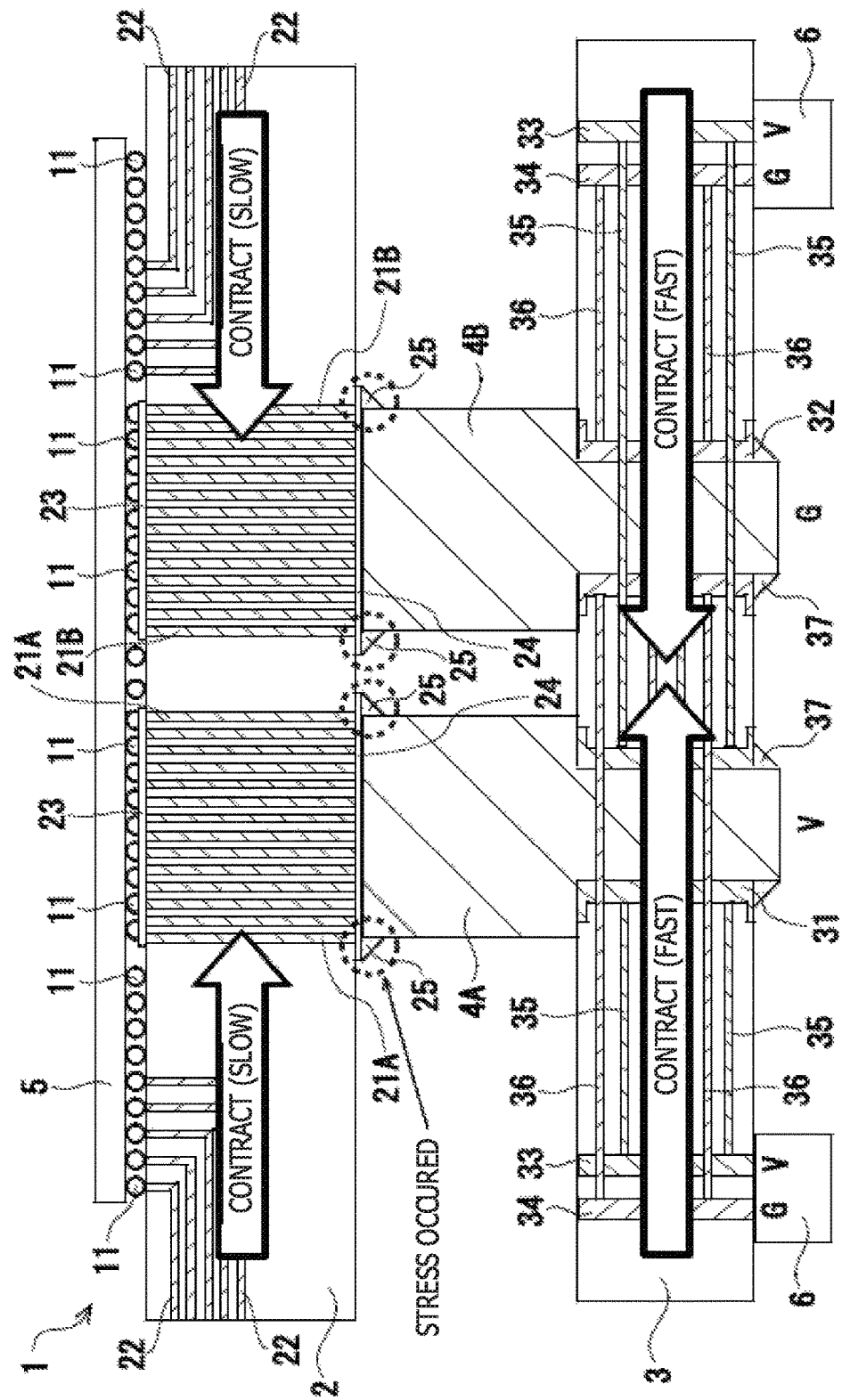
FIG. 18 is a schematic view of the power supply board.

In a case where the rigidity of the pillars 4A and 4B is low, the pillars 4A and 4B are bent when the pillars 4A and 4B follow the behavior of each of the main board 2 and the power board 3, such that the stress occurring in the solder 25 is alleviated. However, as described above, when the outer diameter of the pillars 4A and 4B is made larger, the rigidity of the pillars 4A and 4B becomes higher. Therefore, the stress occurring in the solder 25 is increased and thus, the crack (fissure) occurs in the joint surface of the solder 25. FIG. 18 is a schematic view of the power supply board 1 and the portions where the stress occurs are illustrated therein.

Figure 19:
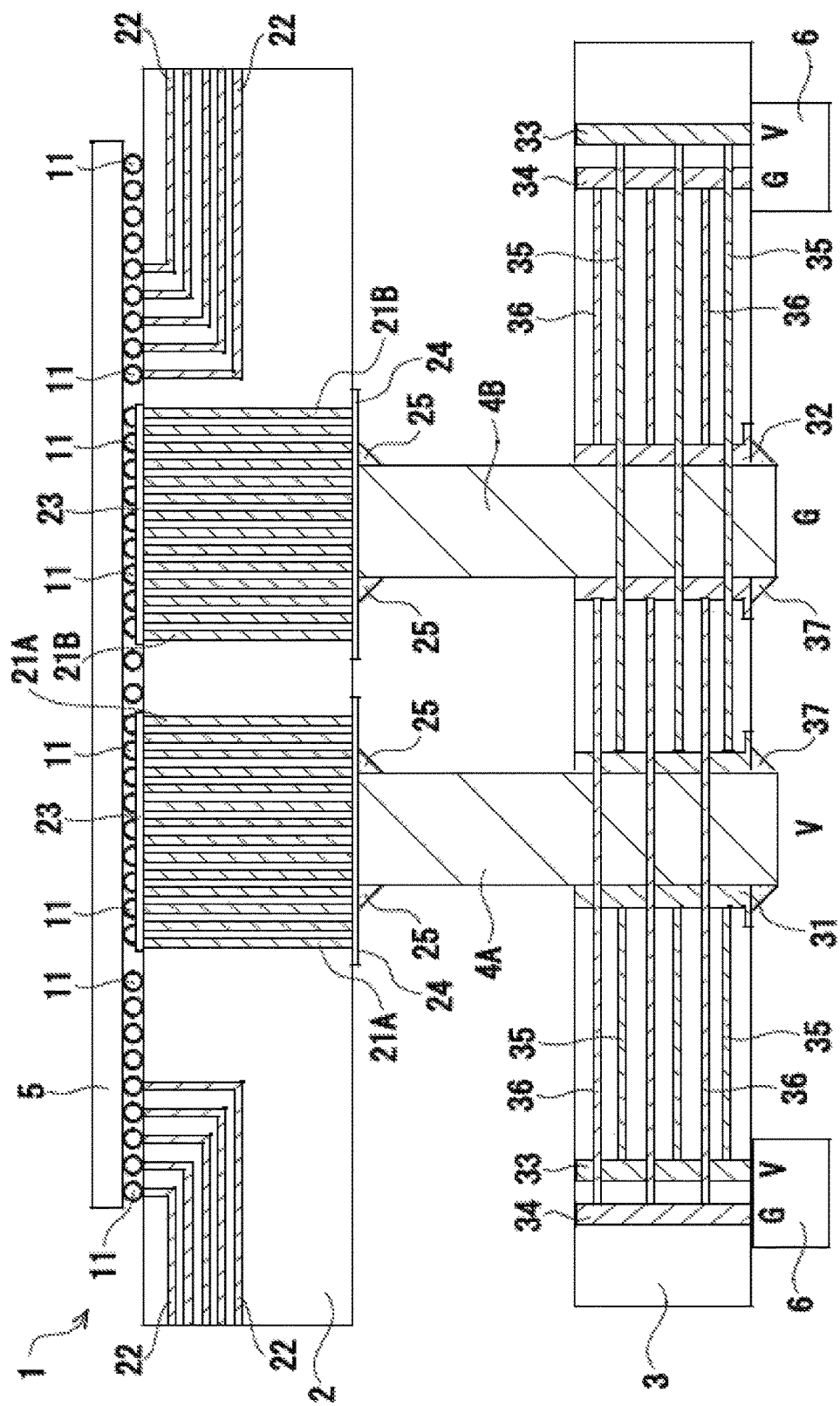
FIG. 19 is a schematic view of the power supply board in a case where the outer diameter of the pillar is made small.

When the outer diameter of the pillars 4A and 4B is made small, the rigidity of the pillar 4A and 4B is reduced. In order to alleviate the stress occurring in the solder 25, as illustrated in FIG. 19, a method of making the outer diameter of the pillars 4A and 4B smaller may be considered as a method of coping the problem. However, when the outer diameter of the pillar 4A is made small, the joining area (contact area) of the pillar 4A and the through hole 21A is decreased, and when the outer diameter of the pillar 4B is made small, the joining area (contact area) of the pillar 4B and the through hole 21B is decreased. Therefore, there is a possibility that the power to be supplied to the CPU 5 is insufficient. Further, when the outer diameter of the pillars 4A and 4B is made small, the joining area of the solder 25 is decreased and thus, the joining strength of the solder 25 may be reduced.

Figure 20:
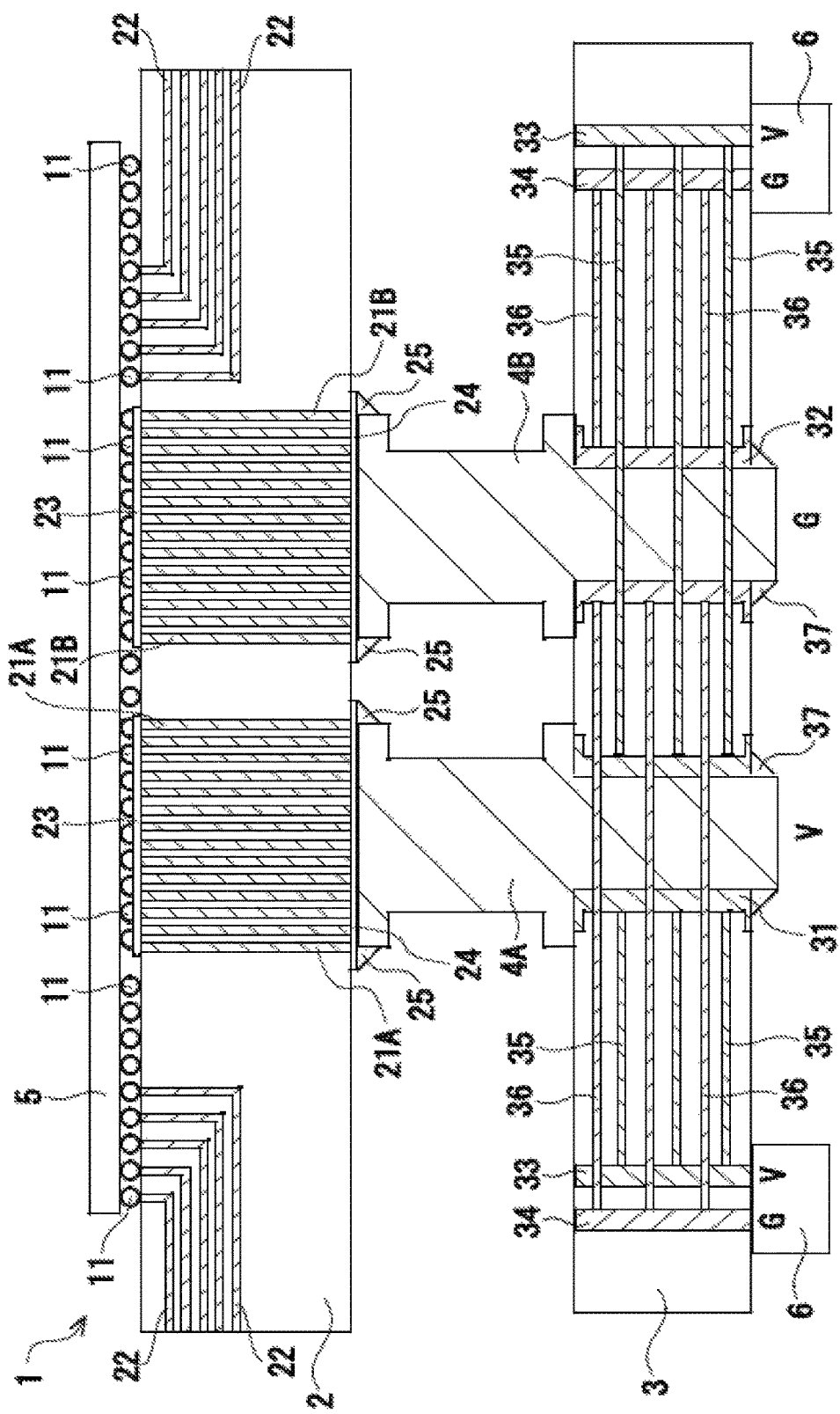
FIG. 20 is a schematic view of the power supply board.
Figure 21:
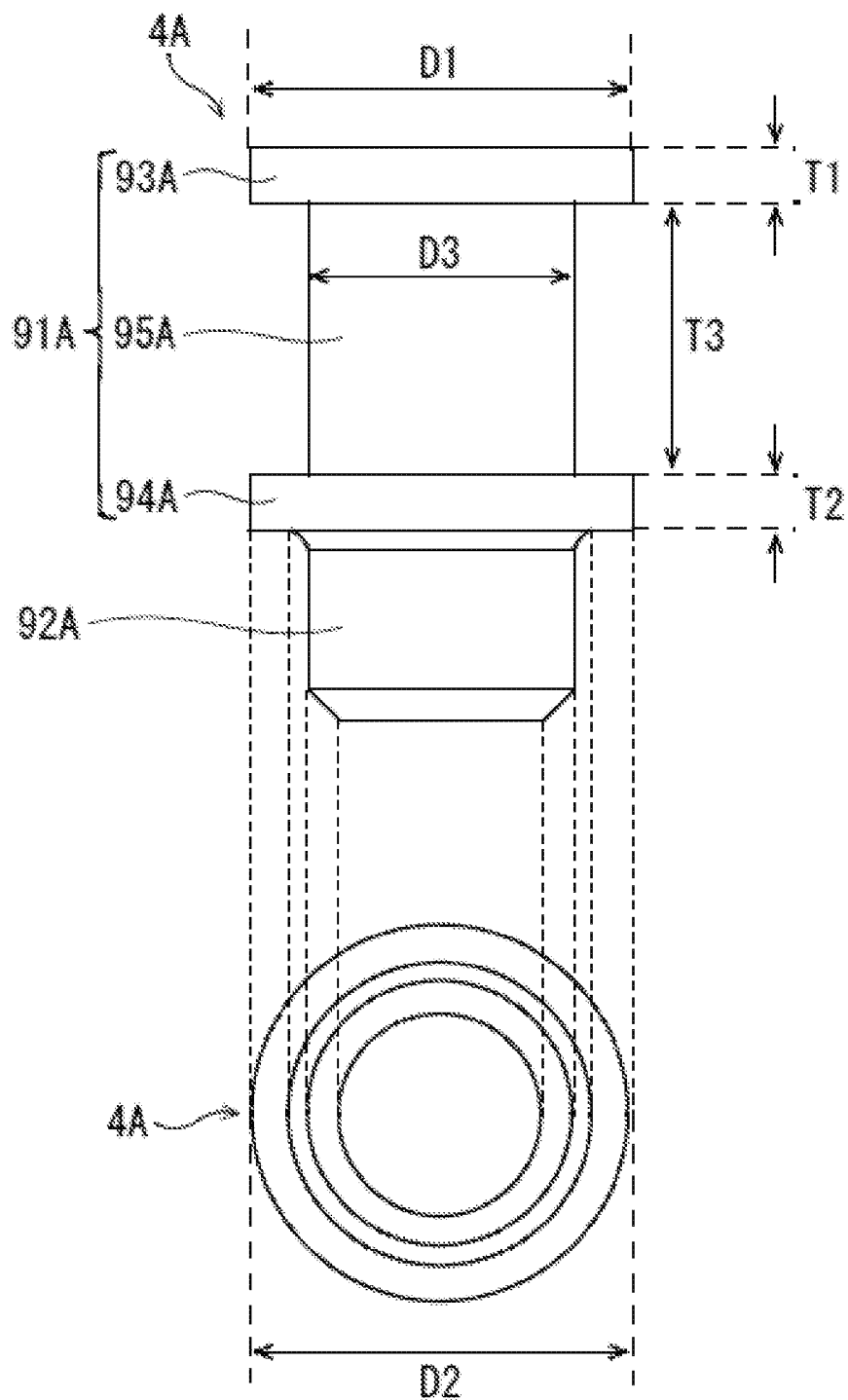
FIG. 21 is a diagram illustrating an outer appearance of a pillar.

Descriptions will be made on the power supply board 1 according to Embodiment 3. FIG. 20 is a schematic view of the power supply board 1. FIG. 21 is a diagram illustrating an outer appearance of the pillar 4A and illustrates the side surface and the bottom surface of the pillar 4A. The pillar 4A includes a first portion 91A mounted on the main board 2 and a second portion 92A mounted on the power board 3. The second portion 92A of the pillar 4A is inserted into a hole of the through hole 31 which penetrates through the power board 3. The first portion 91A of the pillar 4A includes a first columnar portion 93A, a second columnar portion 94A, and a third columnar portion 95A formed (arranged) between the first columnar portion 93A and the second columnar portion 94A.

The first columnar portion 93A of the pillar 4A is mounted on the bottom surface of the main board 2. The second columnar portion 94A of the pillar 4A is connected with the second portion 92A of the pillar 4A. Further, the second columnar portion 94A of the pillar 4A is in contact (connection) with the top surface of the power board 3. The size of the outer diameter (e.g., a first diameter) of the first columnar portion 93A of the pillar 4A is the same as that of the outer diameter (e.g., a second diameter) of the second columnar portion 94A of the pillar 4A. The outer diameter of the first columnar portion 93A of the pillar 4A (D1 of FIG. 21) is, for example, φ7 mm. The outer diameter of the second columnar portion 94A of the pillar 4A (D2 of FIG. 21) is, for example, φ7 mm. The thickness of the first columnar portion 93A of the pillar 4A (T1 of FIG. 21) is, for example, 1 mm. The thickness of the second columnar portion 94A of the pillar 4A (T2 of FIG. 21) is, for example, 1 mm. The outer diameter of the second columnar portion 94A of the pillar 4A is larger than the outer diameter of the second portion 92A of the pillar 4A. Accordingly, since the pillar 4A has a flange shape (e.g., a stepped shape), the pillar 4A is prevented from being dislocated in manufacturing.

The third diameter of the third columnar portion 95A of the pillar 4A is smaller than the first diameter of the first columnar portion 93A of the pillar 4A and the second diameter of the second columnar portion 94A of the pillar 4A. The third diameter of the third columnar portion 95A of the pillar 4A (D3 of FIG. 21) is, for example, φ6 mm. Accordingly, the first portion 91A of the pillar 4A has a shape in which the intermediate portion (the third columnar portion 95A) between the upper portion (the first columnar portion 93A) and the lower portion (the second columnar portion 94A) is made thinner. When the cross sectional area of the third columnar portion 95A of the pillar 4A has secured an area where the power used by the CPU 5 may be supplied, the third diameter of the third columnar portion 95A of the pillar 4A may be made small as much as possible. The thickness of the third columnar portion 95A of the pillar 4A (T3 of FIG. 21) is, for example, 5 mm.

Figure 22:
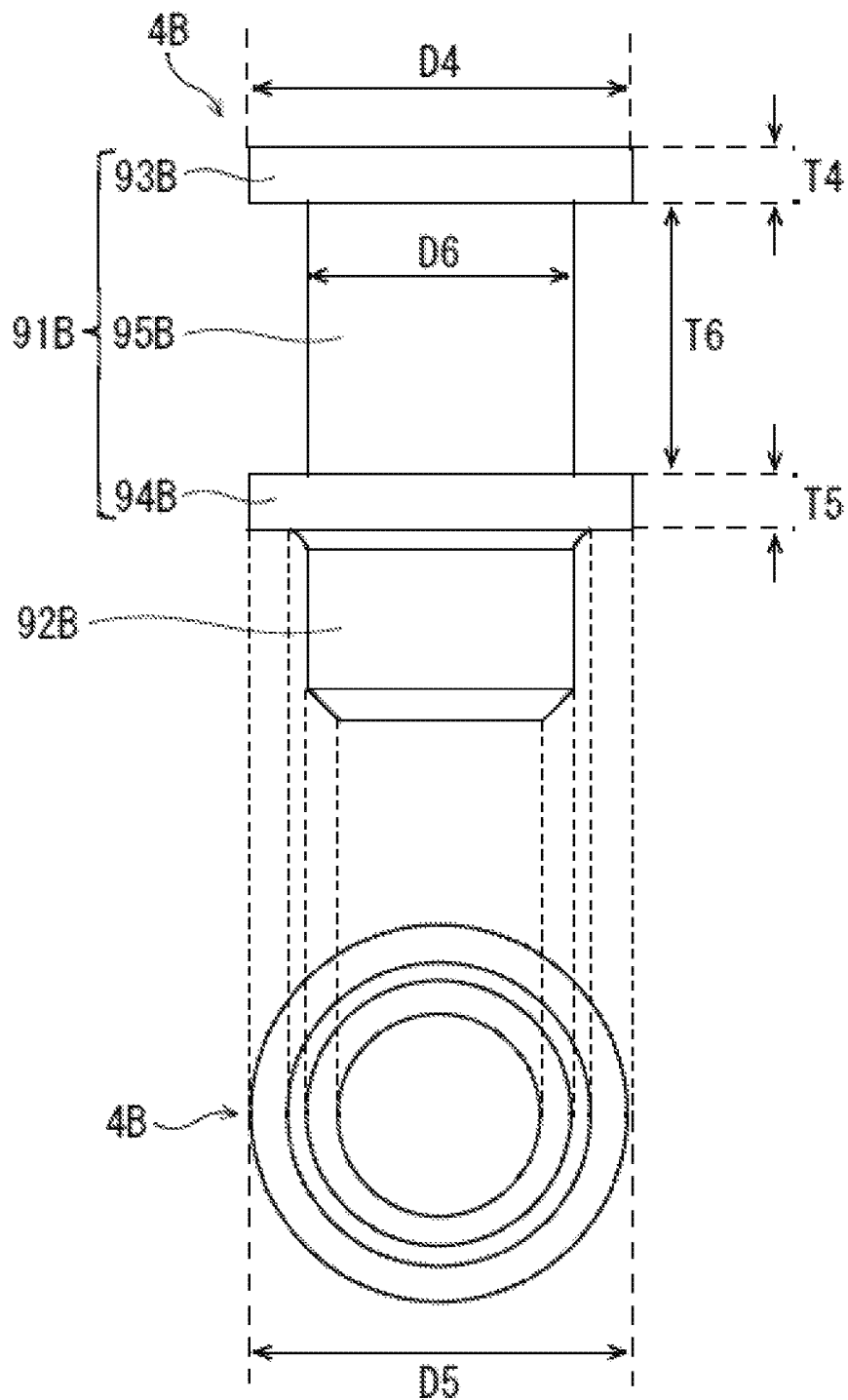
FIG. 22 is a diagram illustrating another outer appearance of the pillar.

FIG. 22 is a diagram illustrating an outer appearance of the pillar 4B and illustrates the side surface and the bottom surface of the pillar 4B. The pillar 4B includes a first portion 91B mounted on the main board 2 and a second portion 92B mounted on the power board 3. The second portion 92B of the pillar 4B is inserted into a hole of the through hole 32 which penetrates through the power board 3. The first portion 91B of the pillar 4B includes a first columnar portion 93B, a second columnar portion 94B, and a third columnar portion 95B formed (arranged) between the first columnar portion 93B and the second columnar portion 94B.

The first columnar portion 93B of the pillar 4B is mounted on the bottom surface of the main board 2. The second columnar portion 94B of the pillar 4B is connected with the second portion 92B of the pillar 4B. Further, the second columnar portion 94B of the pillar 4B is in contact (connection) with the top surface of the power board 3. The size of the outer diameter (e.g., a first diameter) of the first columnar portion 93B of the pillar 4B is the same as that of the outer diameter (e.g., a second diameter) of the second columnar portion 94B of the pillar 4B. The outer diameter of the first columnar portion 93B of the pillar 4B (D4 of FIG. 22) is, for example, φ7 mm. The outer diameter of the second columnar portion 94B of the pillar 4B (D5 of FIG. 22) is, for example, φ7 mm. The thickness of the first columnar portion 93B of the pillar 4B (T4 of FIG. 22) is, for example, 1 mm. The thickness of the second columnar portion 94B of the pillar 4B (T5 of FIG. 22) is, for example, 1 mm. The outer diameter of the second columnar portion 94B of the pillar 4B is larger than that of the second portion 92B of the pillar 4B. Accordingly, since the pillar 4B has a flange shape (e.g., a stepped shape), the pillar 4B is prevented from being dislocated in manufacturing.

The third diameter of the third columnar portion 95B of the pillar 4B is smaller than the first diameter of the first columnar portion 93B of the pillar 4B and the second diameter of the second columnar portion 94B of the pillar 4B. The third diameter of the third columnar portion 95B of the pillar 4B (D6 of FIG. 22) is, for example, φ6 mm. Accordingly, the first portion 91B of the pillar 4B has a shape in which the intermediate portion (e.g., third columnar portion 95B) between the upper portion (e.g., first columnar portion 93B) and the lower portion (e.g., second columnar portion 94B) is made thinner. When the cross sectional area of the third columnar portion 95B of the pillar 4B has secured an area where the power used by the CPU 5 may be supplied, the third diameter of the third columnar portion 95B of the pillar 4B may be made as small as possible. The thickness of the third columnar portion 95B of the pillar 4B (T6 of FIG. 22) is, for example, 5 mm.

The rigidity of the pillars 4A and 4B may be represented by a cross-sectional secondary moment from the standpoint of strength of materials. The rigidity becomes higher as the value of cross-sectional secondary moment becomes larger. The circular cross-sectional secondary moment (I) is obtained by Equation 1.

$$I=\pi d4/64 \quad \text{[Equation 1]}$$

Where d is the diameter of the pillar 4A or 4B.

When the value of the diameter of the pillar 4A (d=φ7 mm) according to Embodiment 1 is substituted for Equation 1, the value of cross-sectional secondary moment of the pillar 4A according to Embodiment 1 is obtained as I=117.8. The pillar 4A according to Embodiment 1 has a straight shape in which the intermediate portion between the upper portion and the lower portion of the pillar 4A is not made thinner. When the value (d=φ6 mm) of the diameter of the third columnar portion 95A of the pillar 4A according to Embodiment 3 is substituted for Equation 1, the value of cross-sectional secondary moment of the third columnar portion 95A of the pillar 4A according to Embodiment 3 is obtained as I=63.6. Accordingly, the value of cross-sectional secondary moment of the third columnar portion 95A of the pillar 4A according to Embodiment 3 is reduced to be about 54% of the value of cross-sectional secondary moment of the pillar 4A according to Embodiment 1. From the result, it may be seen that the rigidity of the pillar 4A according to Embodiment 3 is reduced to be smaller than the rigidity of the pillar 4A according to Embodiment 1. Here, while descriptions has been made on the pillar 4A, since the pillar 4B also has the same shape of the pillar 4A, a result for the pillar 4B becomes the same as the result for the pillar 4A, and the rigidity of the pillar 4B according to Embodiment 3 is reduced to be smaller than the rigidity of the pillar 4B according to Embodiment 1.

It was confirmed that the stress occurring in the solder 25 according to Embodiment 3 is reduced based on a result obtained by performing an analysis of the stress occurring in the solder 25 according to Embodiment 1 and an analysis of the stress occurring in the solder 25 according to Embodiment 3. The conditions and results of the stress analysis are described below.

Analysis condition: A temperature difference of the inside of the server apparatus is 65° C. and the temperature difference of the inside of the server apparatus is a difference between the highest temperature when the temperature of the inside of the server apparatus is increased and the lowest temperature when the temperature of the inside of the server apparatus is decreased.

Analysis result 1: The stress occurring in the solder 25 according to Embodiment 1 is 28.69 MPa (the maximum value).

Analysis result 2: The stress occurring in the solder 25 according to Embodiment 3 is 25.99 MPa (the maximum value).

From the analysis result 1 and analysis result 2, it may be seen that the stress occurring in the solder 25 according to Embodiment 3 is reduced by about 9%.

In FIG. 21, an example of a case where the outer diameter of the second columnar portion 94A of the pillar 4A is larger than the outer diameter of the second portion 92A of the pillar 4A is illustrated. Embodiment 3 is not limited to the example illustrated in FIG. 21, and the size of the outer diameter of the second columnar portion 94A of the pillar 4A may be the same as that of the outer diameter of the second portion 92A of the pillar 4A. In FIG. 22, an example of a case where the outer diameter of the second columnar portion 94B of the pillar 4B is larger than the outer diameter of the second portion 92B of the pillar 4B is illustrated. Embodiment 3 is not limited to the example illustrated in FIG. 22, and the size of the outer diameter of the second columnar portion 94B of the pillar 4B may be the same as that of the outer diameter of the second portion 92B of the pillar 4B.

In the power supply board 1 according to Embodiment 3, the pillar 4A may include the third columnar portion 95A thinner than the first columnar portion 93A and the second columnar portion 94A such that the stress occurring in the solder 25 is reduced. The outer diameter of the first columnar portion 93A of the pillar 4A is not made small. Therefore, the joining area of the pillar 4A and the through hole 21A is not decreased and also the joining area of the solder 25 is not decreased. Accordingly, in the power supply board 1 according to Embodiment 3, the joining strength of the solder 25 may be maintained while avoiding insufficient supplying of the power for the CPU 5.

In the power supply board 1 according to Embodiment 3, the pillar 4B may include the third columnar portion 95B thinner than the first columnar portion 93B and the second columnar portion 94B such that the stress occurring in the solder 25 is reduced. The outer diameter of the first columnar portion 93B of the pillar 4B is not made small. Therefore, the joining area of the pillar 4B and the through hole 21B is not decreased and also the joining area of the solder 25 is not decreased. Accordingly, in the power supply board 1 according to Embodiment 3, the joining strength of the solder 25 may be maintained while avoiding insufficient supplying of the power for the CPU 5.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A power supply board comprising:
   a first board including a top surface on which a processor is capable of being mounted, a bottom surface located on an opposite side of the top surface, and a plurality of first through holes and a plurality of second through holes each capable of being electrically connected with the processor by penetrating through the first board from the top surface to the bottom surface;
   a second board arranged at a position spaced apart from the bottom surface of the first board and provided with a power supply device;
   a first continuous conductor mounted on the bottom surface of the first board and electrically connecting all of the first through holes to the power supply device; and
   a second continuous conductor mounted on the bottom surface of the first board and electrically connecting all of the second through holes to the power supply device.

2. The power supply board according to claim 1, wherein a power supply voltage is supplied from the power supply device to the processor through the first through hole and the first conductor, and a ground voltage is supplied from the power supply device to the processor through the second through hole and the second conductor.

3. The power supply board according to claim 1, wherein the first conductor is arranged at a location just below the first through holes and a central portion of the second board, the second conductor is arranged at a location just below the second through holes and the central portion of the second board, and the power supply device is arranged at an outer periphery outside of the central portion of the second board.

4. The power supply board according to claim 1, wherein the first conductor and the second conductor are a first connector, and the second board include a second connector coupled with the first connector.

5. The power supply board according to claim 1, wherein the first conductor includes a first portion mounted on the bottom surface of the first board and a second portion inserted into a third through hole penetrating through the second board, and a diameter of the first portion of the first conductor is larger than a diameter of the hole provided in the third through hole.

6. The power supply board according to claim 1, wherein the second conductor includes a first portion mounted on the bottom surface of the first board and a second portion inserted into a fourth through hole penetrating through the second board, and a diameter of the first portion of the second conductor is larger than a diameter of the hole provided in the fourth through hole.

7. The power supply board according to claim 1, wherein the first conductor includes a first columnar portion mounted on the bottom surface of the first board, a second columnar portion which is in contact with the second board, and a third columnar portion formed between the first columnar portion and the second columnar portion, and a diameter of the third columnar portion is smaller than a diameter of the first columnar portion and a diameter of the second columnar portion.

8. The power supply board according to claim 1, wherein the second conductor includes a first columnar portion mounted on the bottom surface of the first board, a second columnar portion which is in contact with the second board, and a third columnar portion formed between the first columnar portion and the second columnar portion, and a diameter of the third columnar portion is smaller than a diameter of the first columnar portion and a diameter of the second columnar portion.

9. The power supply board according to claim 1, wherein the first board includes a plurality of signal transmission paths that are formed inside thereof and transmit a signal processed by the processor.

10. The power supply board according to claim 9, wherein each of the plurality of signal transmission paths includes wirings extending in a planar direction of the first board and vias extending in a thickness direction of the first board.

11. The power supply board according to claim 1, wherein first solder balls and second solder balls are provided between the processor and the first board, the first solder balls and the first through holes are connected to each other through a single first surface pattern, and the second solder balls and the second through holes are connected to each other through a single second surface pattern.

12. The power supply board according to claim 11, wherein the number of the first through holes is made greater than the number of the first solder balls, and the number of the second through holes is made greater than the number of the second solder balls.

13. The power supply board according to claim 1, wherein the first through holes and the first conductor are connected to each other through a single first surface pattern, and the second through holes and the second conductor are connected to each other through a single second surface pattern.

14. The power supply board according to claim 1, wherein each of the first conductor and the second conductor is a pillar including a first portion and a second portion thinner than the first portion.

* * * * *